United States Patent
Rosa et al.

(10) Patent No.: US 6,632,373 B1
(45) Date of Patent: *Oct. 14, 2003

(54) METHOD FOR AN OPTICAL SWITCH ON A SUBSTRATE

(75) Inventors: Michel A. Rosa, San Jose, CA (US); Eric Peeters, Fremont, CA (US); David K. Fork, Los Altos, CA (US)

(73) Assignee: Xerox Corporation, Stamford, CT (US)

( * ) Notice: Subject to any disclaimer, the term of this patent is extended or adjusted under 35 U.S.C. 154(b) by 125 days.

This patent is subject to a terminal disclaimer.

(21) Appl. No.: 09/675,093

(22) Filed: Sep. 28, 2000

(51) Int. Cl.[7] .................. B29D 11/00; B02B 26/08; G02F 1/03
(52) U.S. Cl. .................. 216/24; 385/12; 385/16; 257/415; 216/2
(58) Field of Search .................. 216/24, 2; 257/415; 385/12, 16; 359/248

(56) References Cited

U.S. PATENT DOCUMENTS

| | | | | |
|---|---|---|---|---|
| 6,061,323 A | | 5/2000 | Jerman et al. | 369/112 |
| 6,091,537 A | * | 7/2000 | Sun et al. | 359/248 |
| 6,201,629 B1 | * | 3/2001 | McClelland et al. | 359/223 |
| 6,271,958 B1 | * | 8/2001 | Lin et al. | 359/298 |
| 6,283,601 B1 | | 9/2001 | Hagelin et al. | 359/871 |
| 6,299,462 B1 | * | 10/2001 | Biegelsen | 200/181 |
| 6,300,665 B1 | * | 10/2001 | Peeters et al. | 257/415 |
| 6,360,036 B1 | | 3/2002 | Couillard | 385/19 |
| 2001/0030817 A1 | | 10/2001 | Hagelin | 359/871 |

* cited by examiner

Primary Examiner—Robert Kunemund
Assistant Examiner—Shamim Ahmed

(57) ABSTRACT

Optical cross-connect systems involve the general concept of a two dimensional array of MEMS tilt mirrors being used to direct light coming from a first optical fiber to a second optical fiber. Each MEMS tilt mirror in the two dimensional array can tilt about two non-colinear axes and is suspended by a plurality of suspension arms attached to a substrate.

26 Claims, 55 Drawing Sheets

METHOD FOR AN OPTICAL SWITCH ON A SUBSTRATE

CROSS-REFERENCE TO RELATED APPLICATIONS

The present invention is related to U.S. patent application Ser. No. 09/675,945, now issued as U.S. Pat. No. 6,411,427; U.S. patent application Ser. No. 09/675,108, now issued as U.S. Pat. No. 6,466,356; U.S. patent application Ser. No. 09/672,380, now issued as U.S. Pat. No. 6,300,665; U.S. patent application Ser. No. 09/675,045, now issued as U.S. Pat. No. 6,504,643; U.S. patent application Ser. Nos. 09/675,046; 09/672,381, now issued as U.S. Pat. No. 6,501,588; and U.S. patent application Ser. No. 09/675,812, all filed on the same day and assigned to the same assignee.

BACKGROUND

For optical telecommunication systems it is often necessary to switch the oath of the transmitted light. Numerous different approaches have been suggested. Optical switching based on micro-electromechanical system (MEMS) mirrors is particularly attractive for communication systems. Optical switches using reflecting MEMS mirrors are convenient because free-space light transmission is used and scaling to a large-scale optical cross-connect system is possible. This is important because of current demand for optical cross-connect systems on the order of 1000×1000. Actuation to move the MEMS mirrors in an optical cross-connect system is typically electrostatic, electromagnetic, piezoelectric or thermal.

SUMMARY

Optical cross-connect systems in accordance with an embodiment of the invention involve the general concept of a two dimensional array of MEMS tilt mirrors being used to direct light coming from a first optical fiber to a second optical fiber. Each MEMS tilt mirror in the two dimensional array can tilt about two non-colinear axes and is suspended by a plurality of suspension arms attached to a substrate.

BRIEF DESCRIPTION OF THE DRAWINGS

FIG. 7l shows a top view of a patterned mask used for processing.

DETAILED DESCRIPTION

Figure 1:
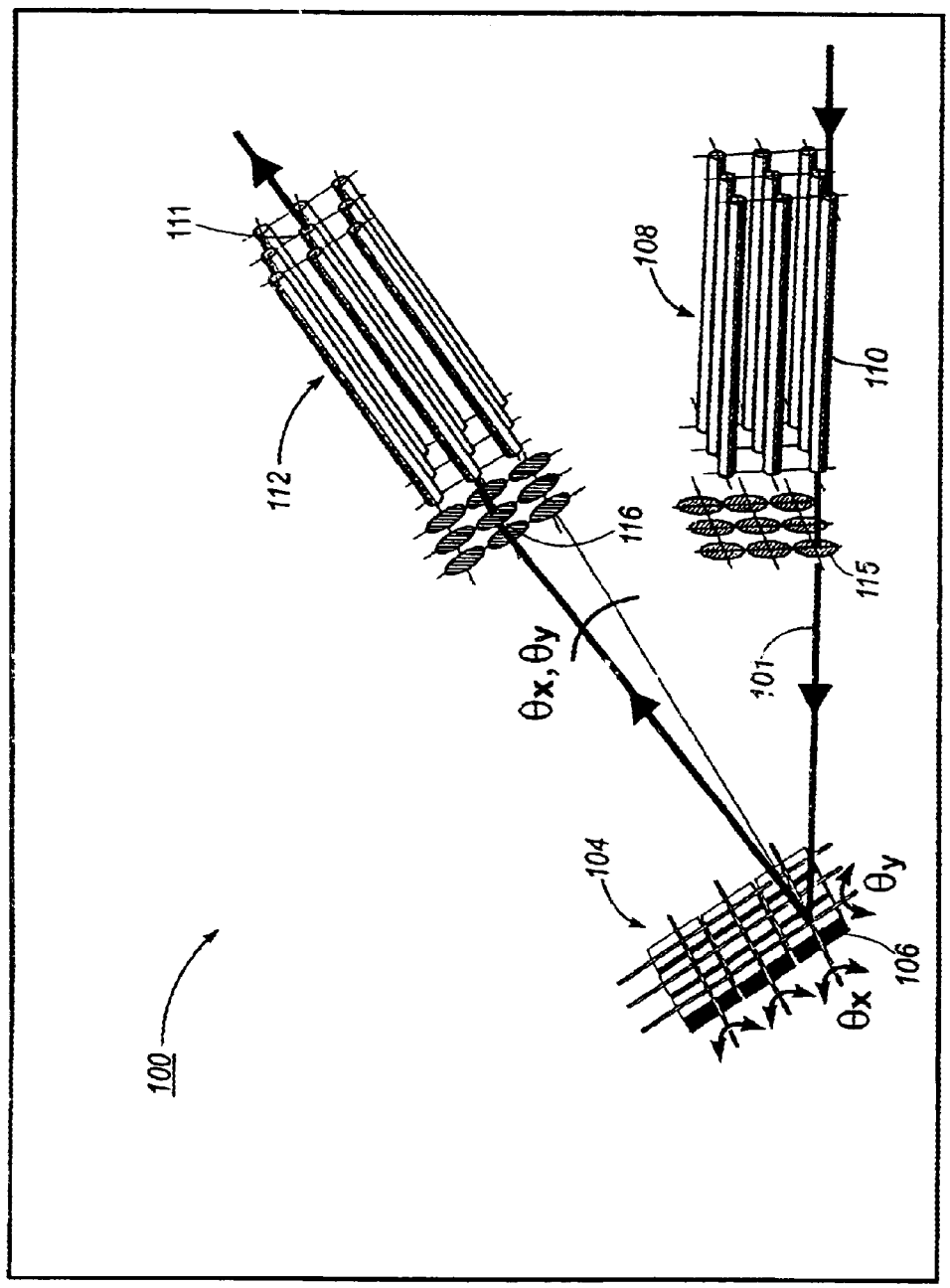
FIG. 1 shows an embodiment of an n x m optical cross connect system in accordance with the invention.

FIG. 1 shows an embodiment of optical cross-connect system 100 in accordance with the invention. Two dimensional array 104 of MEMS tilt mirrors 106 is used to direct light beam 101 coming from two dimensional array 108 of optical fibers 110 to two dimensional array 112 of optical fibers 111. Each mirror 106 can rotate about two non-colinear axes in general. A typical diameter for mirror 106 is in the range of 300 $\mu$m to 1000 $\mu$m. For example, light beam 101 emerging from optical fiber 110 is collimated using lenslet 115 typically having a diameter greater than about 50 μm and projected onto tilt mirror 106 which directs light beam 101 onto lenslet 116 which focuses light beam 101 into optical fiber 111. Hence, using optical cross-connect system 100, light beam 101 coming from any one of optical fibers 110 in two dimensional array 108 may be directed by one of mirrors 106 of two dimensional array 104 into selected optical fiber 111 of two dimensional optical fiber array 112. Note that the number of tilt mirrors 106 is equal to the number of optical fibers 110 coming in which in turn is equal to the number of optical fibers 111 going out for optical cross-connect system 100.

Figure 2A:
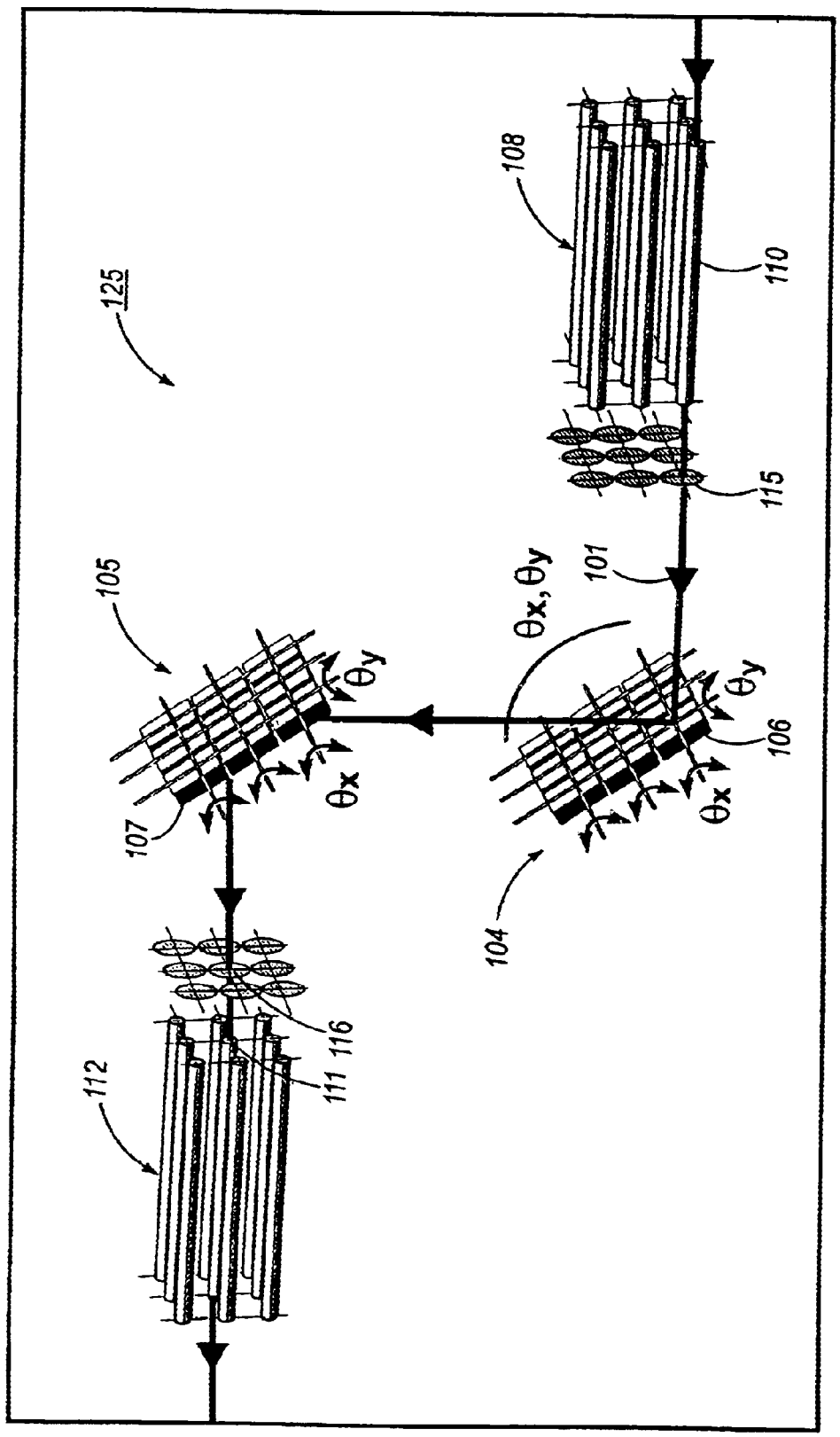
FIG. 2a shows an embodiment of a two mirror array optical cross connect system in accordance with the invention.

Light beam 101 in FIG. 1 generally does not enter optical fibers 111 head-on and this may lead to aperture issues for optical fibers 111, especially for larger optical fiber arrays or shorter optical paths resulting in larger scan angles. FIG. 2a shows optical cross-connect system 125 in accordance with the invention. Optical cross-connect system 125 allows optical fibers 111 to be entered head-on by light beam 101. Optical cross-connect system 125 introduces two dimensional array 105 of tilt mirrors 107 to assure that light beam 101 enters optical fiber 111 head-on. Light beam 101 originating from optical fiber 110 first strikes tilt mirror 106 and is reflected onto tilt mirror 107 which reflects light beam 101 head-on to optical fiber 111. However, optical cross-connect system 125 requires double the number of tilt mirrors that is required using optical cross-connect system 100. The maximum mirror tilt angle is the maximal angular displacement required of mirror 106 or mirror 107 for addressing the most distant mirrors in array 105 or 104, respectively. Typical maximum mirror tilt angles for this configuration assuming an optical path length of 8 cm given a beam radius of 180 μm are approximately 3.25° for two dimensional arrays 104 and 105.

Figure 2B:
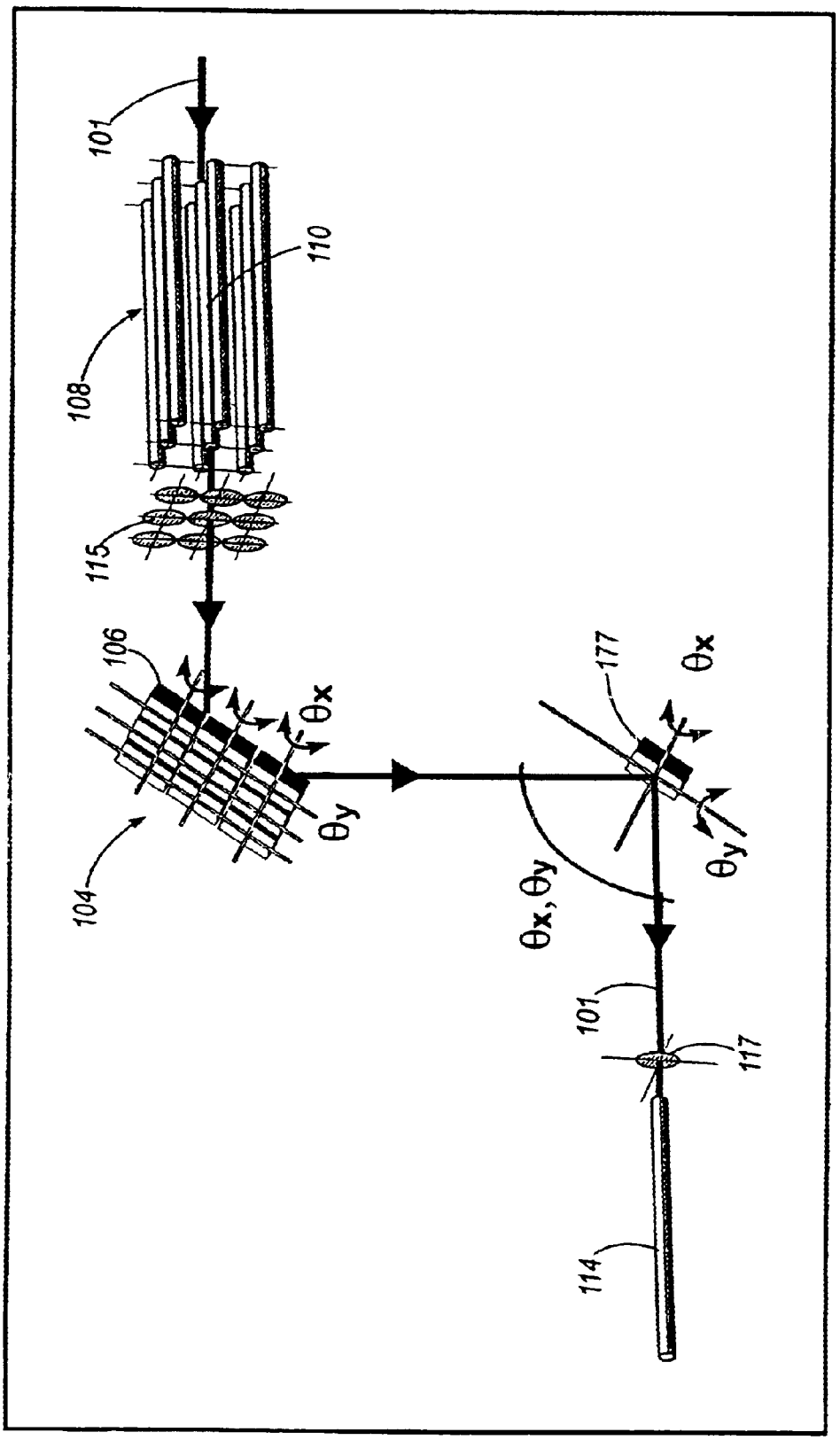
FIG. 2b shows an embodiment of an optical switch system in accordance with the invention.

FIG. 2b shows an embodiment in accordance with the invention for an n×1 optical switch for optical circuit switching. Light beam 101 exits from one of optical fibers 110 in optical fiber array 108 to pass through lenslet array 115 for collimation and passing to tilt mirror array 104 to be reflected by tilt mirror 106 onto tilt mirror 177 which directs light beam 101 through lenslet 117 into desired one of optical fibers 114. An application for an n×1 optical switch is to multiplex a selectable subset of m different wavelengths from n (n≧m) different optical fibers 110 in array 108 into desired one of optical fibers 114.

Figure 2C:
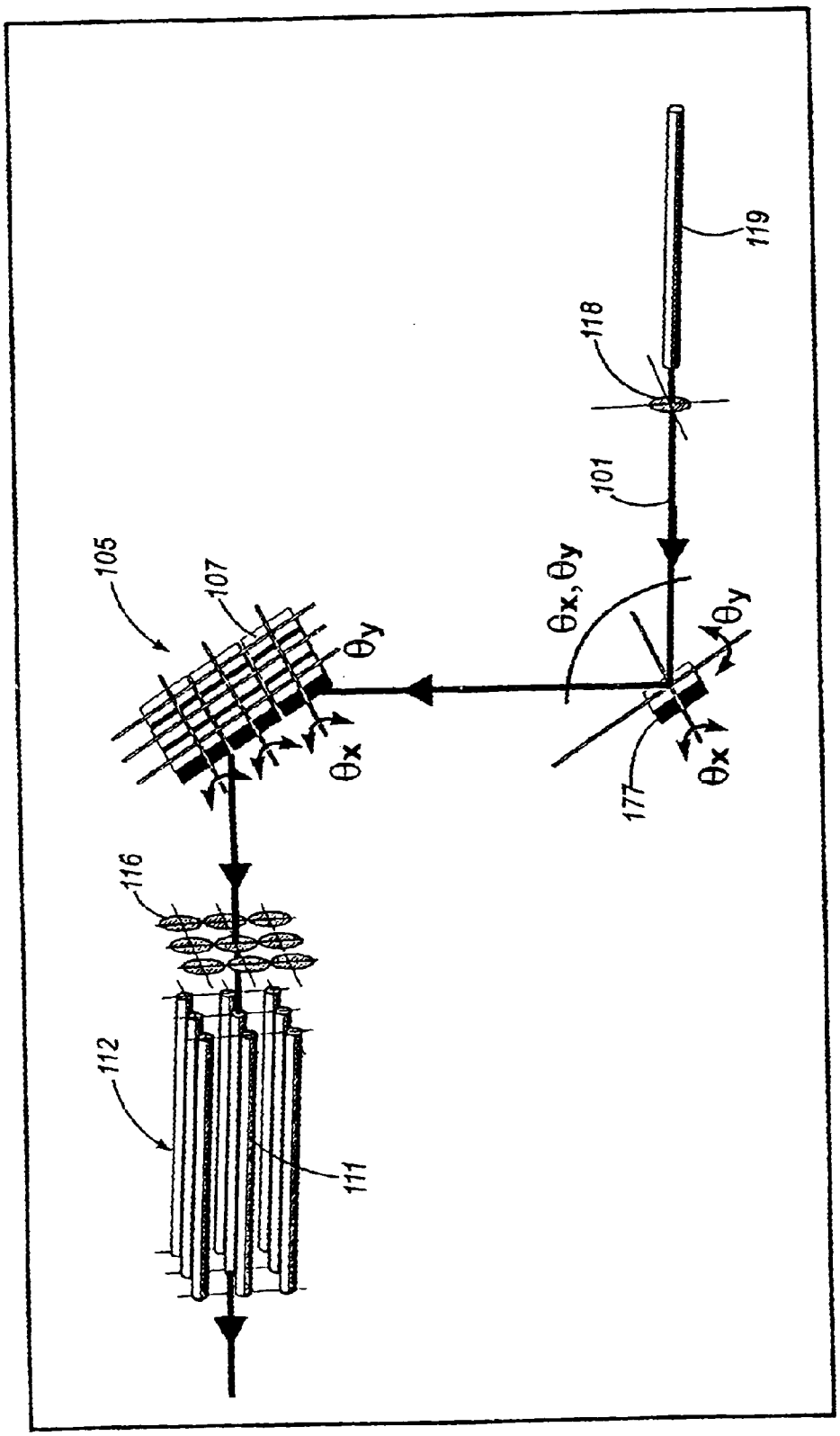
FIG. 2c shows an embodiment of an optical switch system in accordance with the invention.

FIG. 2c shows an embodiment in accordance with the invention for a 1×n optical switch for optical circuit switching. Light beam 101 exits from optical fiber 119 passing through lenslet 118 for collimation and being reflected by tilt mirror 177 onto desired tilt mirror 107 in tilt mirror array 105. Tilt mirror 107 reflects light beam 101 through lenslet array 116 for collimation and into desired one of optical fibers 111 in optical fiber array 112. An application for a 1×n optical switch is to route optical beam 101 from optical fiber 119 to any one of optical fibers 111.

Figure 3A:
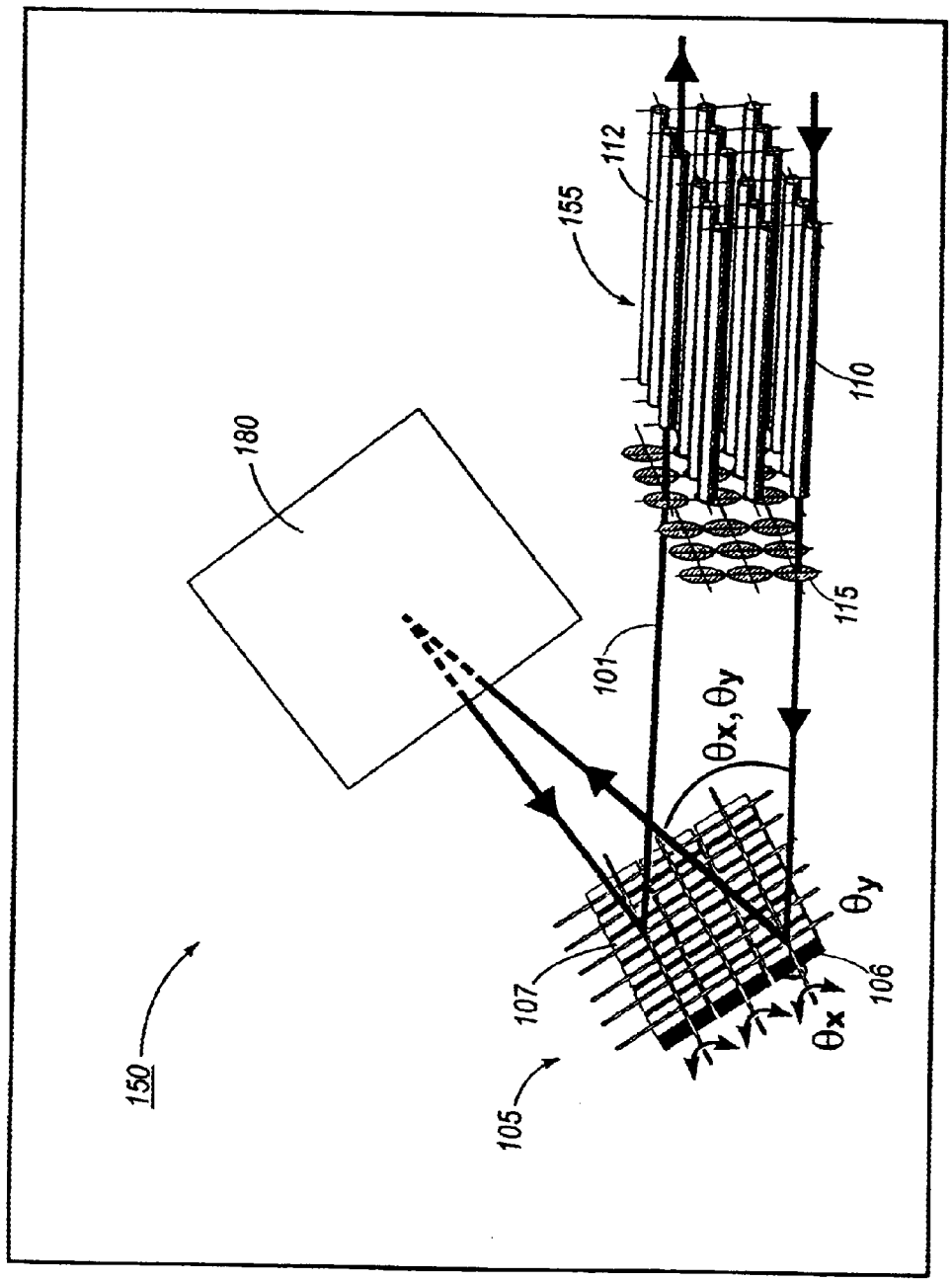
FIG. 3a shows an embodiment of an n×m optical cross connect system in accordance with the invention.

Another embodiment in accordance with the invention is shown in FIG. 3a. Optical cross-connect system 150 has two dimensional array 165 of tilt mirrors 106 and 107 and two dimensional array 155 consisting of incoming optical fibers 110 and outgoing optical fibers 112. In addition, optical cross-connect system 150 incorporates reflector 180. Light beam 101 leaves optical fiber 110 for collimation by lenslet 115 and is reflected off of tilt mirror 106 onto reflector 180. From reflector 180 light beam 101 is reflected off of tilt mirror 107 into lenslet 115 which focuses light beam 101 head-on into optical fiber 112.

Figure 3B:
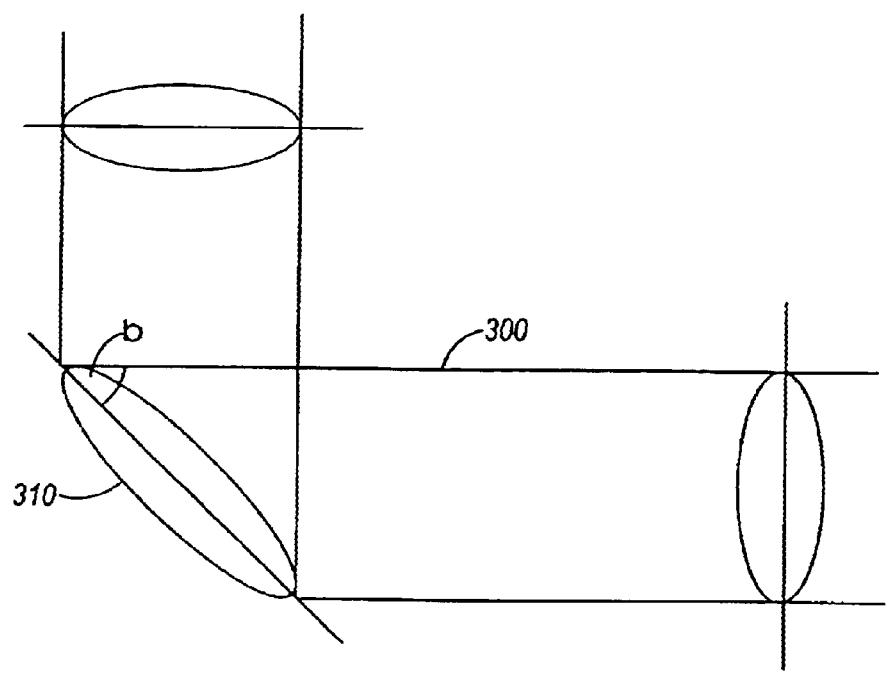
FIG. 3b shows dependence of mirror shape on angular incidence.

Mirror shape can be adjusted to be a circle, ellipse or polygon. For example, mirror shapes that are elliptical can be used to capture the projection of a circular beam that is incident at an angle. FIG. 3b shows circular beam 300 incident on ellipsoidal mirror 310 at angle β with respect to the rays of circular beam 300. An optimum aspect ratio for ellipsoidal mirror 310 can be derived from angle β.

Figure 4A:
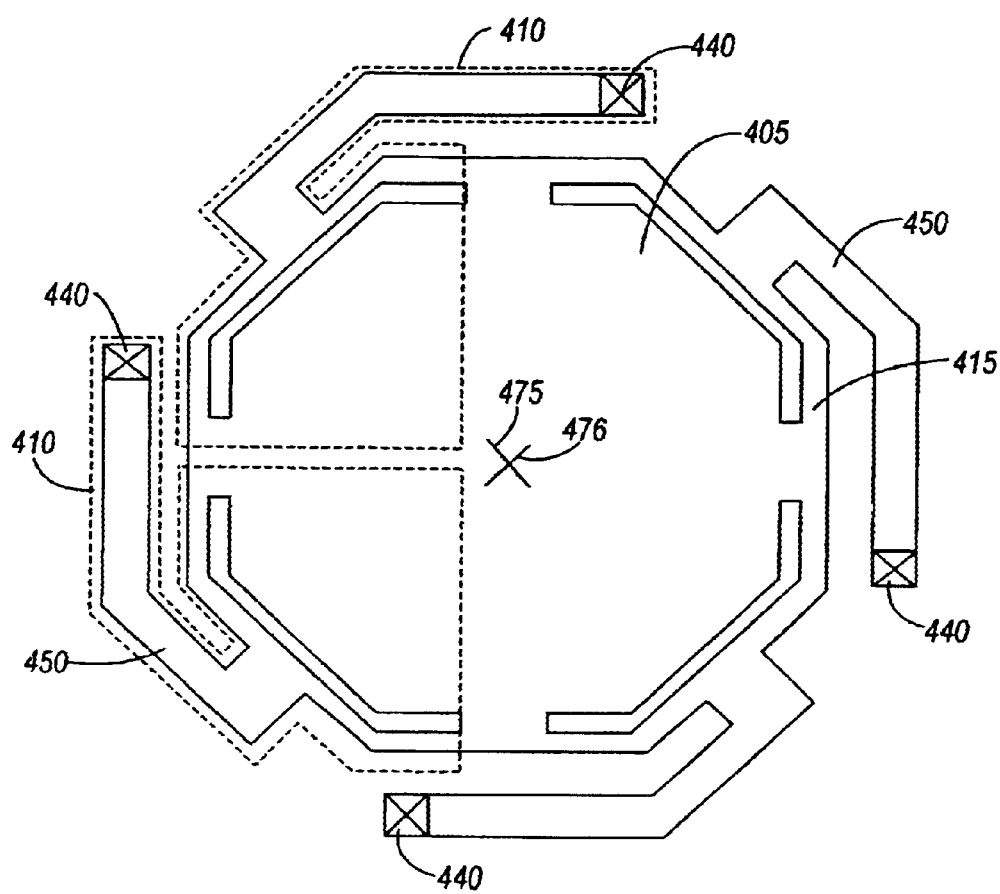
FIG. 4a shows an embodiment of a tilt mirror structure in accordance with the invention.

FIG. 4a shows the basic structure of tilt mirrors 106 and tilt mirrors 107 in accordance with an embodiment of the invention. Other geometries are possible for the tilt mirror structure but the geometry of the alternatives to suspension arms 450 must allow for elongation of the tilt mirror structure between anchor points 440. Otherwise the mirror structure cannot raise up after etching of the release layer.

The surface of mirror 405 in FIG. 4a is a substantially flat and stress free metal to allow precise optical pointing. Mirror 405 is attached by flexure hinges 415 to suspension arms 450. Suspension arms 450 are typically made of nickel and provide clearance for rotation about axis 476 and 475 of mirror 405 by actuation of electrodes 410. Mirror 405 is raised automatically during a release etch described below and mirror 405 rotates slightly in its own plane as mirror 405 rises from substrate 499 (see FIG. 5). Typical heights for mirror 405 having a diameter of about 300 to 1000 μm is on the order of 20 to 100 μm. Four actuation electrodes 410 associated with four suspension arms 450, respectively, may be individually charged to tilt mirror 405 about axis 475 and axis 476 with typical actuation voltages being about 10 to 50 volts. In addition, electrodes 410 may extend under mirror structure 405 as shown in FIG. 4a.

Actuation electrodes 410 may be actuated using either a DC or AC drive. If AC actuation is used the frequency of the AC drive needs to be significantly higher than the response time of the mechanical system being actuated. AC drive avoids potential buildup of electric charges in the dielectric materials between or close to actuation electrodes 410. Actuation electrodes 410 are beneficially driven with a bipolar signal, alternating between a positive voltage and an approximately equal negative voltage. The alternating waveform may typically be square shaped sinusoidal, triangular or some other suitable shape as long as the rise and fall times are substantially shorter than the mechanical response time of tilt mirrors 106 and 107, for example.

For the example of a square waveform, a typical drive frequency would be higher than 1 kHz if the mechanical resonance frequency of tilt mirrors 106 and 107 were on the order of 1 kHz. Since the actuation force is proportional to the square of the actuation voltage, the actuation force is independent of the sign of the voltage. The actuation force only varies during the transition from a voltage of one sign to a voltage of the opposite sign. Hence, the transition needs to be short compared to the resonance period of tilt mirrors 106 and 107, for example. The bipolar signal reduces charge accumulation in the dielectric materials since the net charge accumulated in the dielectric material averages to approximately zero. With a DC signal for actuation there is the possibility of a net charge accumulation in the dielectric material over time which may act to screen or otherwise interfere with the applied actuation voltage.

The basic structure shown in FIG. 4a for tilt mirrors 106 and 107 in accordance with the invention is based on stress-engineered metal films. Mirror 405 and flexure hinges 415 are designed to be stress free while suspension arms 450 along the circumference of mirror 405 are made of a nickel having an MoCr layer with a built-in stress gradient deposited on them. Suspension arms 450 are anchored to the substrate at anchor points 440. Flexure hinges 415 serve to attach mirror 405 to suspension arms 450 while isolating the stress and strain from mirror 405 to maintain planarity for optical pointing accuracy and providing the rotational flexibility about axis 477 that is needed for liftup and actuation.

The actuation force for axis 475 and axis 476 is created by the attraction between electrodes 410 situated the substrate and suspension arms 450. In another embodiment in accordance with the invention, electrodes 410 underlie not only suspension arms 450 but are extended under each quadrant of mirror 405 as shown in FIG. 4*a* to increase the total actuation force. However, limiting actuation electrodes 410 to the area underneath suspension arms 450 provides a larger force per unit area as the actuation starts from near anchor point 440 where the initial separation between electrode 410 and suspension arms 450 is smallest and the separation then proceeds to decrease along the length of suspension arm 450 in a "zipper-like" fashion as suspension arm 450 is drawn toward electrode 410.

Figure 4B:
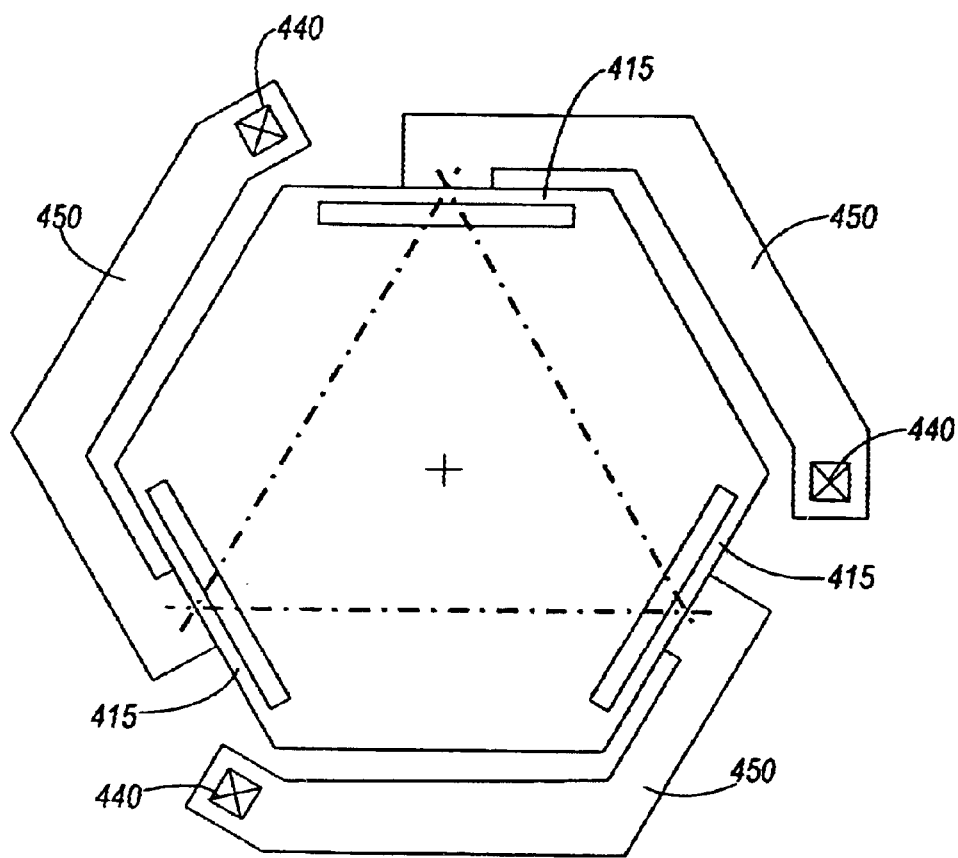
FIG. 4b shows an embodiment of a tilt mirror structure in accordance with the invention.

Two or more suspension arms 450 may be used in the structure for tilt mirrors 106 and 107 with 4 (four) being typical. If mirror actuation is achieved by actuation of suspension arms 450 alone, a minimum of 3 (three) suspension arms 450 is required to allow tilt about two non-collinear axes. FIG. 4*b* shows an embodiment in accordance with the invention of an actuatable mirror structure having 3 (three) suspension arms 450. If mirror actuation about one tilt axis is achieved by having electrodes 410 extend under mirror 405, it is possible to achieve tilting about two axes by having only 2 (two) suspension arms 450.

Figure 4C:
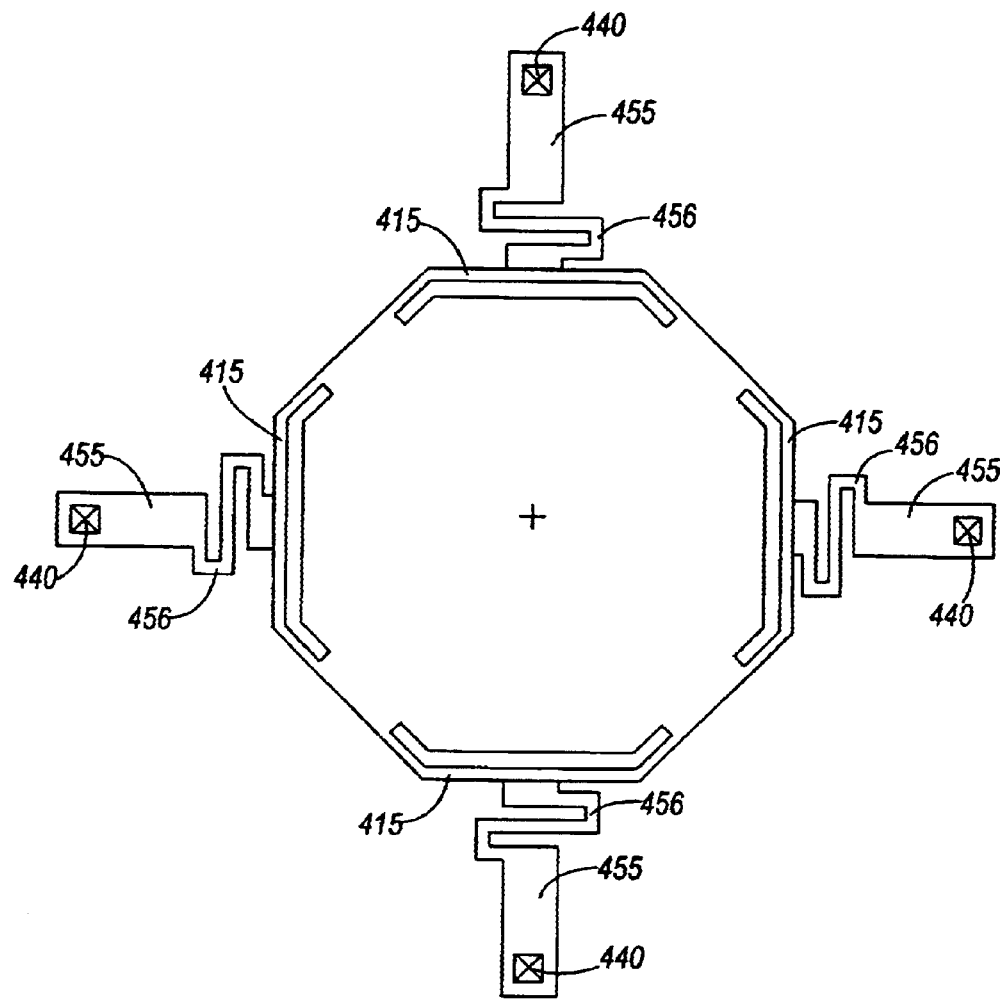
FIG. 4c shows an embodiment of a tilt mirror structure in accordance with the invention.

Other embodiments in accordance with the invention are also possible. For example, a requirement for all suspension schemes is that suspension arms 450 or suspension arms 455 (see FIG. 4*c*) and/or flexure hinges 415 are deformable between anchor points 440. In the embodiments shown in FIGS. 4*a* and 4*b*, the deformation is achieved by using suspension arms 450 that wrap around mirror 405. In the embodiment shown in FIG. 4*c*, the deformation is achieved through longitudinal flexures 456 in suspension arms 455. Other embodiments allowing deformation will be readily apparent to those of ordinary skill in the art.

Figure 5:
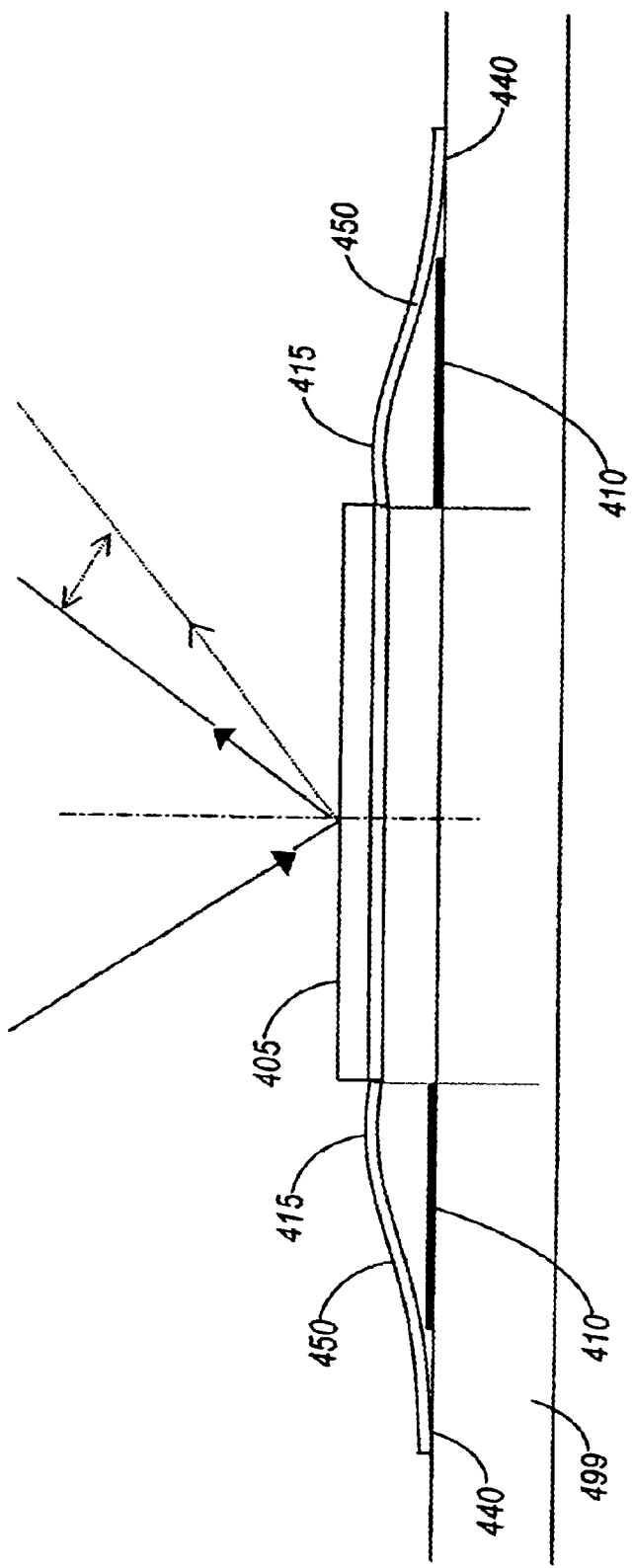
FIG. 5 shows a side view of an embodiment of a tilt mirror structure in accordance with an embodiment of the invention.

FIG. 5 shows the basic structure of FIG. 4*a* in cross-section, showing the placement of electrodes 410 underneath only suspension arms 450.

Optical path length (defined as the optical distance between exit face of incoming optical fiber bundle 108 and the entrance face of outgoing optical fiber bundle 112) effects a number of design parameters. Typical optical paths lie in the range of from about 5 cm–10 cm. A longer optical path for the embodiments shown in FIGS. 1–3 is beneficial because it reduces the scan angle required of mirrors 106 and 107 to address optical fiber arrays 108 and 112, respectively. A reduced scan angle in turn reduces the actuation voltage required for mirrors 106 and 107 to achieve a given resonance frequency or switching speed or results in a higher switching speed if the actuation voltage is kept the same. A reduced scan angle also helps lower the mechanical stresses acting on the flexure elements such as flexure hinges 415 and longitudinal flexures 456. Lowered mechanical stress reduces the potential problems of metal fatigue or hysteresis.

However, increased optical path length increase the need for optical beam collimation. Collimating optics need to be positioned near the exit face of incoming optical fiber bundle 108 and the entrance face of outgoing optical fiber bundle 112. This is typically done with lenslet arrays 115 and 116 but also with graded index (GRIN) collimators, ball lenses or other optical elements suitable for providing collimation. Collimation optics will always leave a finite residual divergence in the optical beam, for example, a commercially available GRIN fiber collimator typically leaves a residual divergence angle of from 0.1 to 0.25 degrees. The divergence angle combined with the optical path length determines the size required for mirrors 106 and 107. To avoid intensity losses, mirrors 106 and 107 need to be larger than the maximum optical beam diameter. For a given divergence angle, a longer optical path requires larger mirrors 106 and 107 which results in larger mirror arrays 104, 105 and 165 and a larger array pitch. A larger array pitch again requires a larger scan angle.

Typical optical beam diameter is about 0.3 mm to 0.5 mm. The beam diameter after the collimation and expansion optics offers a degree of freedom in design. Expansion of the optical beam diameter relaxes the positional tolerances of all the optical elements which results in simplified packaging. However, the size required for mirrors 106 and 107 is increased. Typical mirror diameters are typically on the order of 300 $\mu$m–1 mm. As mirror size increase it is more difficult to keep the mirror surface optically flat. Increasing mirror thickness enhances the ability to keep the mirror surface optically flat. A typical thickness for mirrors 106 and 107 lies in the range of 1–15 $\mu$m.

Figure 6A:
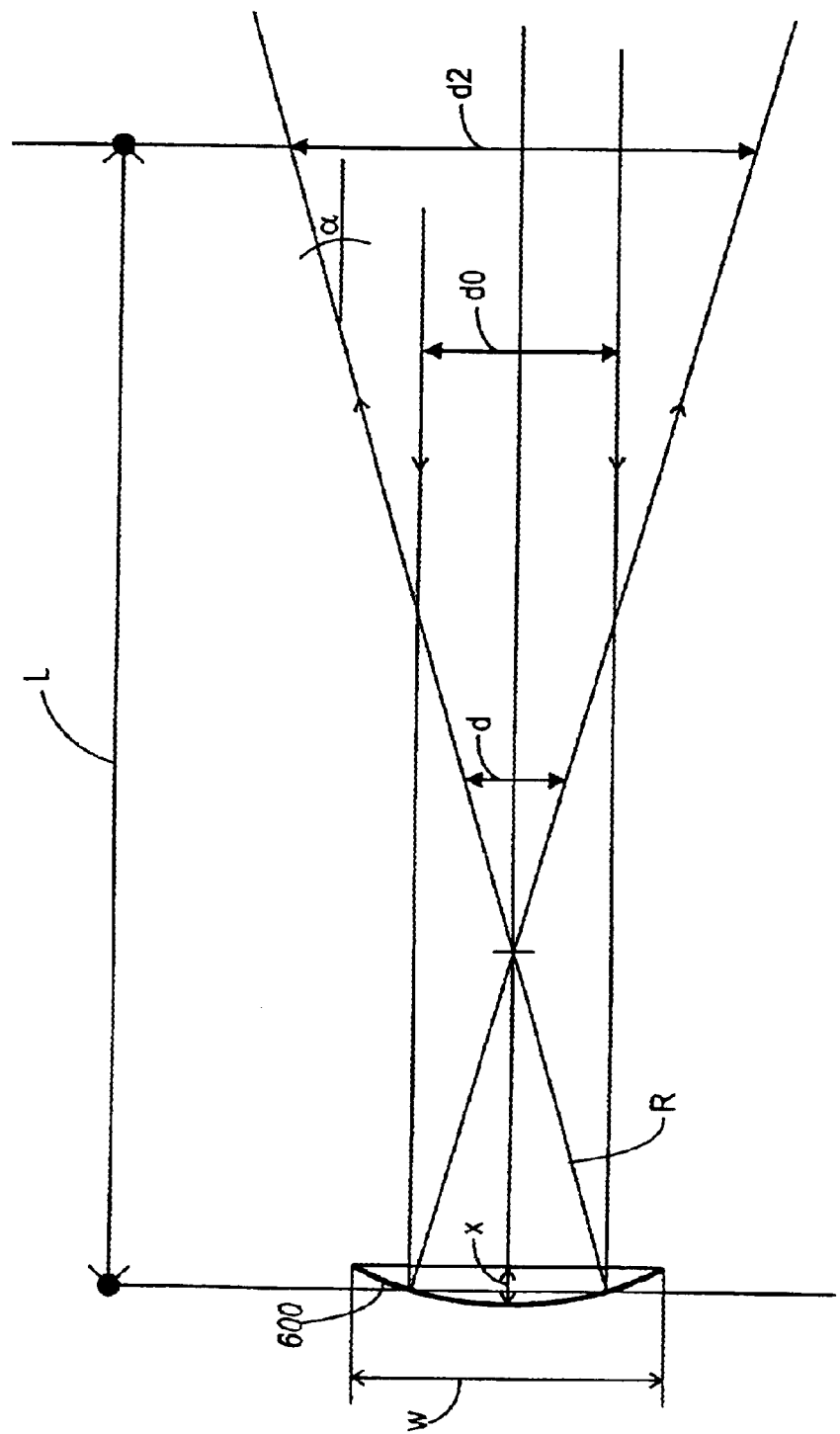
FIG. 6a shows the effect of mirror curvature on optical beam divergence.

Mirrors 106 and 107 may have bow which contributes to optical beam divergence along with residual collimator divergence. FIG. 6*a* shows a cross section of concave mirror 600 having radius of curvature R, diameter w, bow x, incoming collimated beam diameter d0, and diameter d2 is the diameter of the reflected beam at optical path length L away from the surface of concave mirror 600. Bow angle $\alpha \approx \arctan(4x/w)$ is the divergence half angle due to bow x. Assuming that bow x is much less than radius of curvature R it can be shown that beam diameter d as a function of optical path length L is given approximately by:

$$d(L) \sim d0 - 8 \times L/w \quad \text{if } L < 2R \qquad (1)$$

$$d(L) \sim d0 + 8 \times L/w - 2w \quad \text{if } L > 2R \qquad (2)$$

and $d(L)^{18}$ 0 if $L^{18}$ R.

Figure 6B:
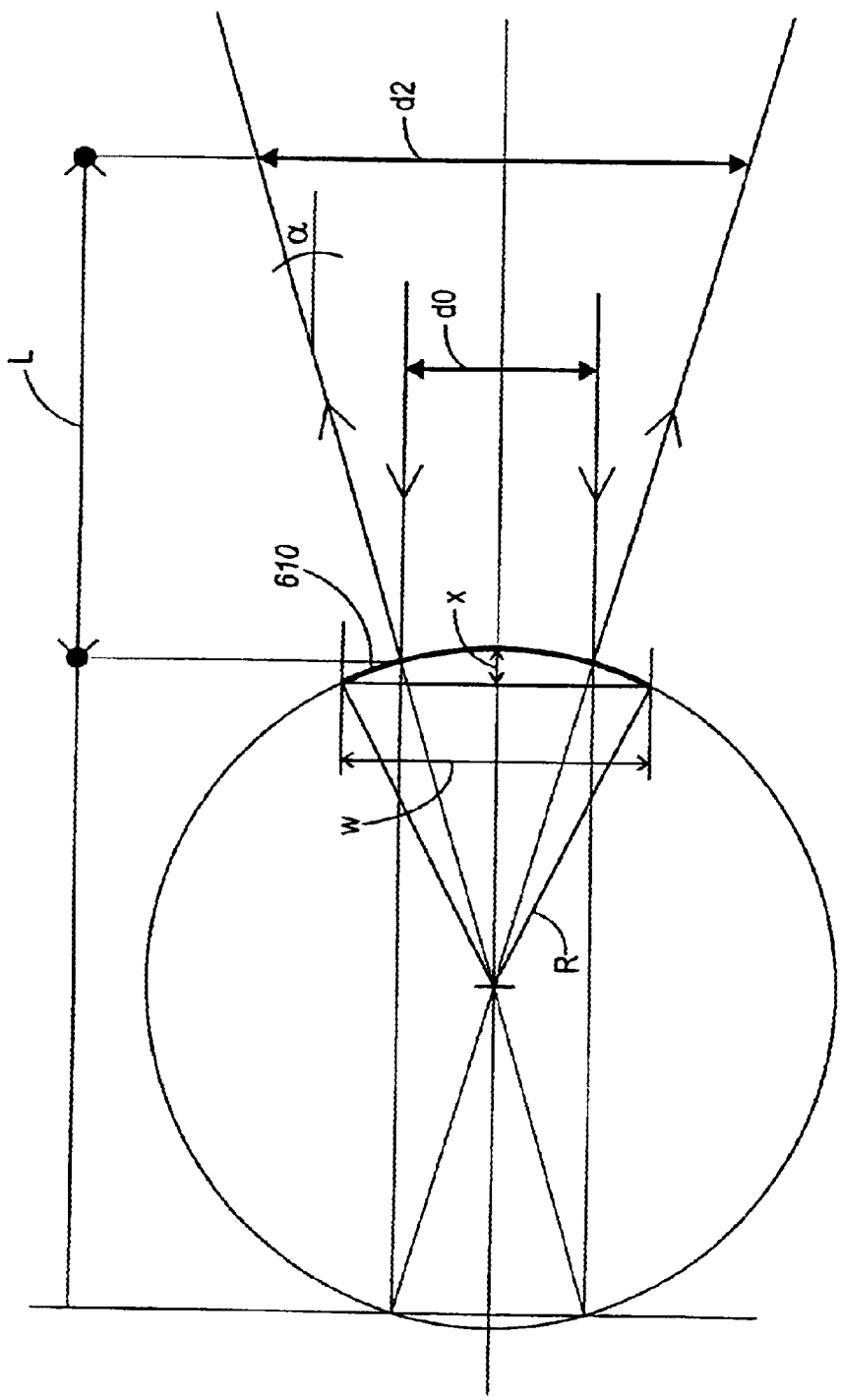
FIG. 6b shows the effect of mirror curvature on optical beam divergence.

FIG. 6*b* shows that beam diameter as a function of optical path length L for convex mirror 610 with optical path length L is given by:

$$d(L) \tilde{D} \, d0 + 8 \times L/w \qquad (3)$$

From the above it is apparent that the optical beam divergence arising from bow angle a must be kept small with respect to the optical beam divergence due to the residual collimation angle due to the collimation optics to maintain acceptable mirror size. For example, if mirror diameter w is 300 $\mu$m, optical path length L is 10 cm and d0 is 250 $\mu$m, bow x of 10 nm is acceptable whereas bow x of 100 nm is not acceptable. Increasing mirror diameter w to 500 $\mu$m allows box x to be 100 nm.

Larger thickness or diameters for mirrors 106 and 107 mean that mirrors 106 and 107 respond more slowly for a given actuation voltage for a fixed suspension stiffness and require a higher actuation voltage for a faster response at a higher suspension stiffness.

For example, larger diameters for mirrors 106 and 107 require a higher clearance from the substrate for a given scan angle. The actuation used for mirrors 106 and 107 becomes unstable once the downward deflection exceeds a certain point. The instability typically occurs when the air gap between suspension arms 450 and electrodes 410 decreases to between about 30% to 50% of the air gap for the unactuated state. In the operation of mirrors 106 and 107 it is desirable to avoid the region of instability when operating at the maximum required tilt angle. To increase the region of stability, it is beneficial to shape electrodes 410 in accordance with an embodiment of the invention. For example, electrodes 410 can be tapered as a function of distance from anchor points 440. A typical shape is then a triangular shape. Reducing width of actuation electrodes 410 along their length gradually reduces the actuation force at a fixed voltage as suspension arms 450 bend down towards actuation electrodes 410. This reduction in actuation force acts to offset the increased actuation force due to the gradually decreasing gap between suspension arm 450 and actuation electrode 410. The decreasing gap is responsible for the onset of the instability.

Hence, the mirror diameter, the required scan angle and the size of the instability region in combination determine the minimum clearance from substrate 499 for mirrors 106 and 107. Clearance is adjusted by appropriate selection of the length of, for example, suspension arms 450 and the magnitude of the stress gradient that is introduced into suspension arms 450. A typical clearance for mirrors 106 and 107 is typically in the range of 20 μm to 200 μm from substrate 499.

The stiffness of the suspension system and the mass of mirrors 106 and 107 determines the resonance frequency of mirrors 106 and 107. For example, in FIG. 4a is the stiffness of the suspension system is determined by the width, length, thickness and material of suspension arms 450 and flexural hinges 415. A higher stiffness results in a higher resonance frequency with a resultant higher switching speed but requires higher actuation voltages. Higher stiffness also reduces the clearance of mirror 405 over substrate 499 for the same stress gradient and geometrical configuration. The ratio of the stiffness of suspension arm 450 to the stiffness of flexural hinge 415 determines what fraction of the actuation force produces the tilt of mirror 405 versus the lowering of mirror 405. Both tilt and lowering of mirror 405 will be present. Hence, it is desirable that the stiffness of flexural hinges 415 is less than the stiffness of suspension arms 450.

Two dimensional micro-mirror arrays such as two dimensional array 104 of MEMS tilt mirrors 106 may be fabricated in a number of ways in accordance with the invention. Various substrates may be used such as, for example, glass, bulk silicon, and silicon on insulator.

Figure 7A:
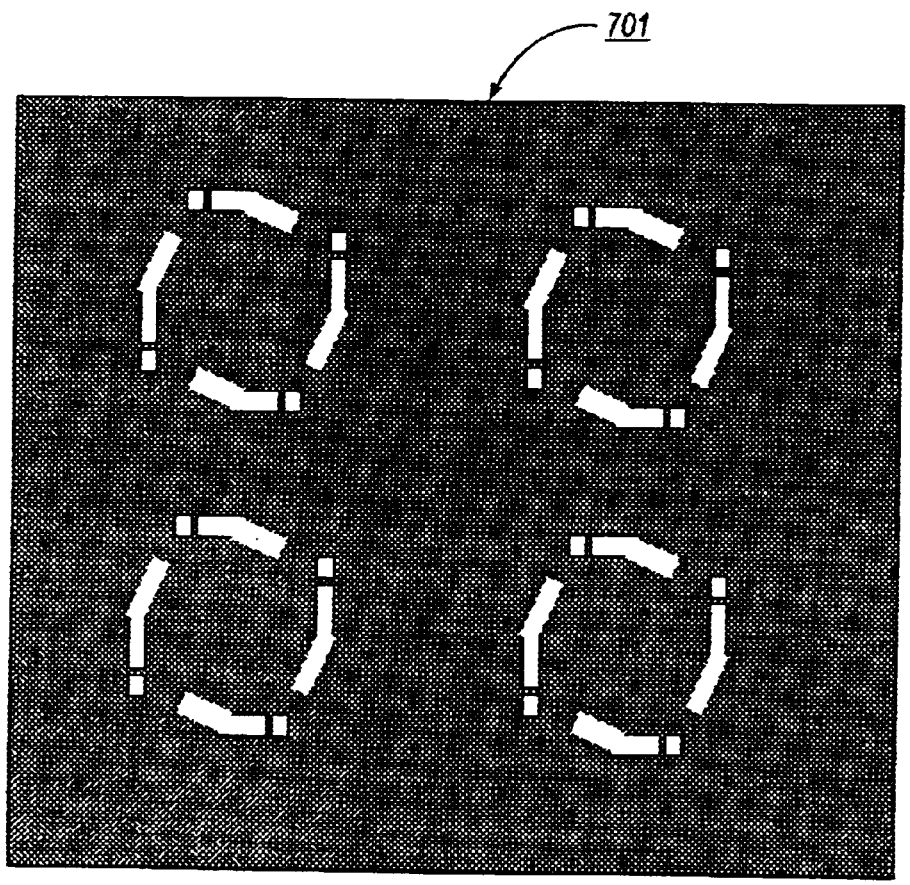
FIG. 7a shows a top view of a patterned mask used for processing.
Figure 7B:
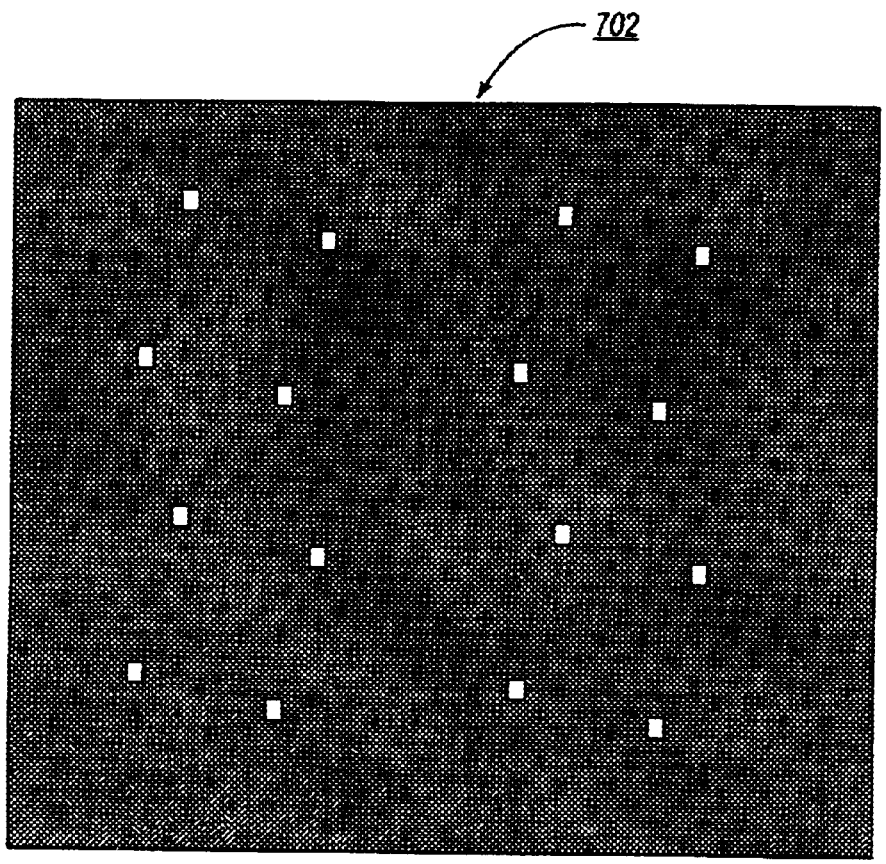
FIG. 7b shows a top view of a patterned mask used for processing.

Note that lift-off masks 701–706 In FIGS. 7a–7f are exemplary and shown for a two by two micro-mirror array but may be adapted to an arbitrary micro-mirror array size or to a single mirror structure. FIGS. 8a–8o show the fabrication steps for two dimensional array 104 of MEMS tilt mirrors 106 using glass as the substrate in accordance with an embodiment of the invention. FIGS. 8a–8o are cross-sectional views taken substantially along line 8—8 in FIG. 9. High quality unannealed glass substrate 801 is cleaned prior to application of photoresist lift-off mask 701. After application, lift-off mask 701 is patterned as shown in FIG. 7a for anchor points 440, actuation electrodes 410 and electrical contacts (not shown). Typically, 100 nm of chromium 813 is sputter deposited over lift-off mask 701. FIG. 8b shows removal of photoresist lift-off mask 701 and the portion of chromium layer 813 overlying photoresist lift-off mask 701 using an acetone soak and leaving actuation electrodes 410 (see FIG. 4) and anchor points 440 in place. Using low pressure chemical vapor deposition (LPCVD), $Si_3N_4$ layer 803 having a typical thickness of about 150 nm is deposited over glass substrate 801, over actuation electrodes 410 (see FIG. 4) and anchor points 440 as shown in FIG. 8c.

Figure 8A:
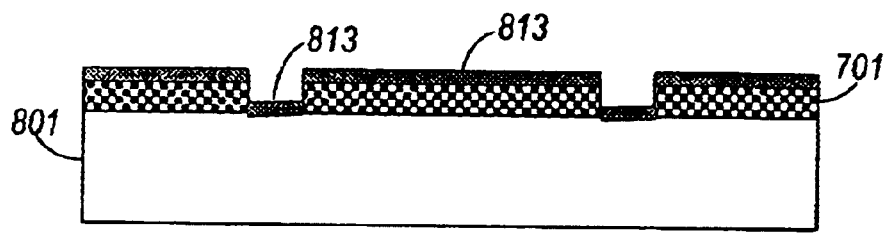
FIGS. 8a–8o show the processing steps in accordance with an embodiment of the invention.
Figure 8B:
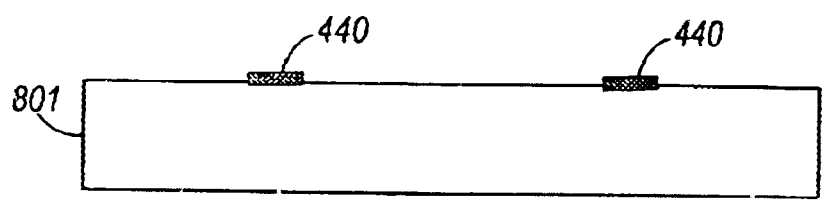
Figure 8C:
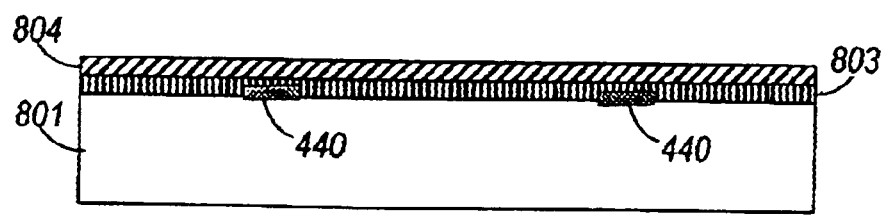
Figure 8D:
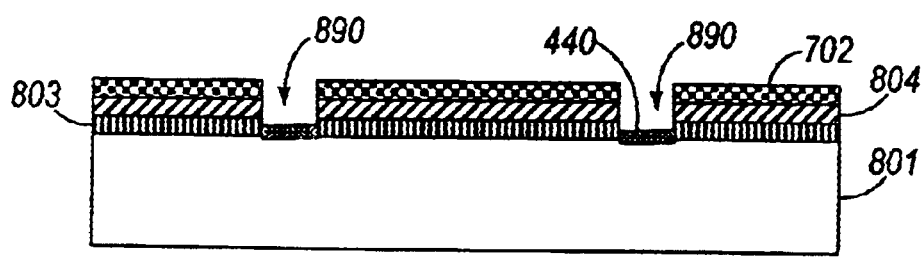
Figure 8E:
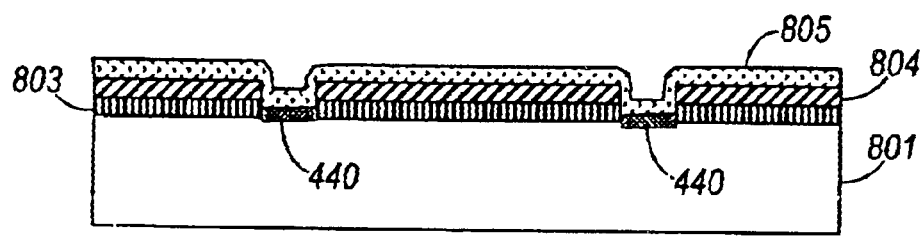

With reference to FIG. 8d, amorphous silicon layer 804 is LPCVD deposited over $Si_3N_4$ layer 803 to a typical thickness of about 500 nm. Photoresist mask 702 is applied over amorphous silicon layer 804 and patterned as shown in FIG. 7b. Vias 890 are dry etched using an $O_2/SF_6$ plasma down to anchor points 440 and electrical contacts (not shown). After removal of photoresist mask 702 using an acetone soak, copper seed layer 805 is deposited to a typical thickness of about 200 nm over amorphous silicon layer 804, electrical contacts (not shown) and anchor points 440 as shown in FIG. 8e.

Figure 7C:
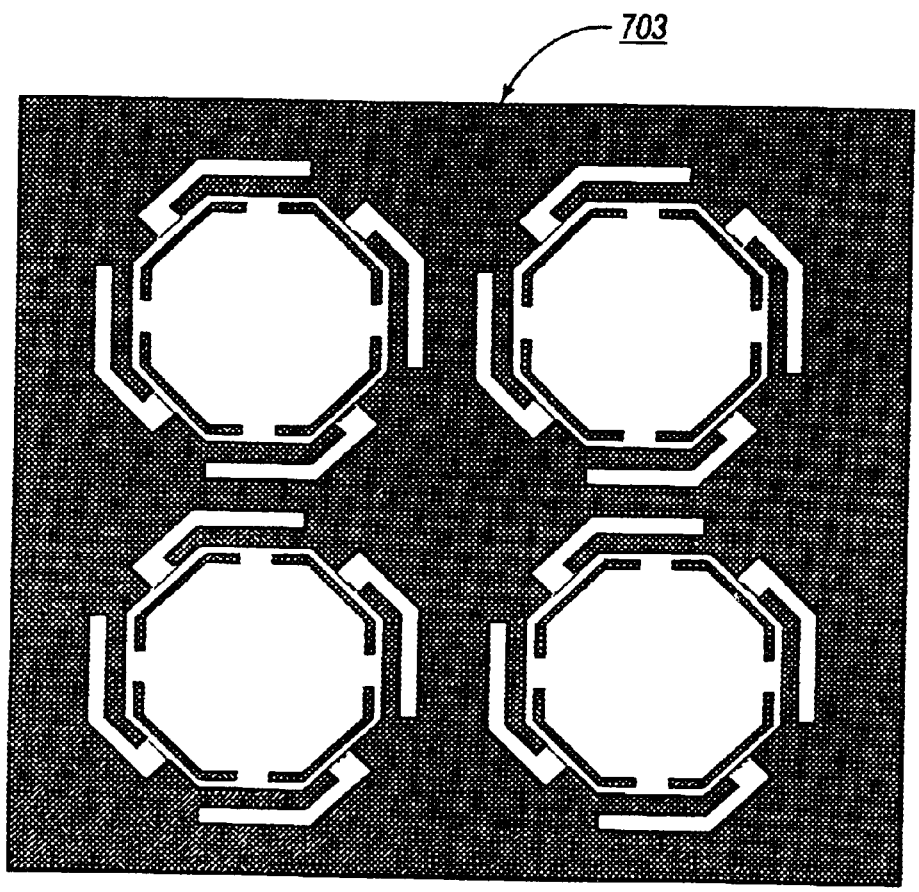
FIG. 7c shows a top view of a patterned mask used for processing.
Figure 7D:
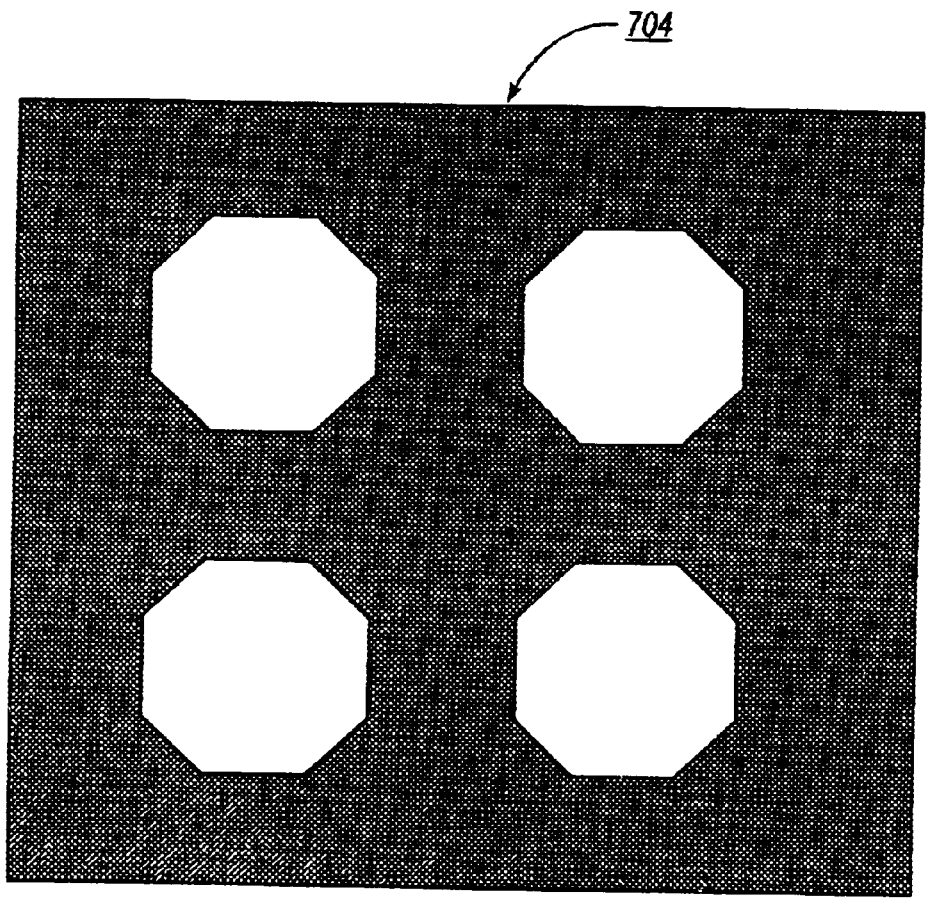
FIG. 7d shows a top view of a patterned mask used for processing.
Figure 8F:
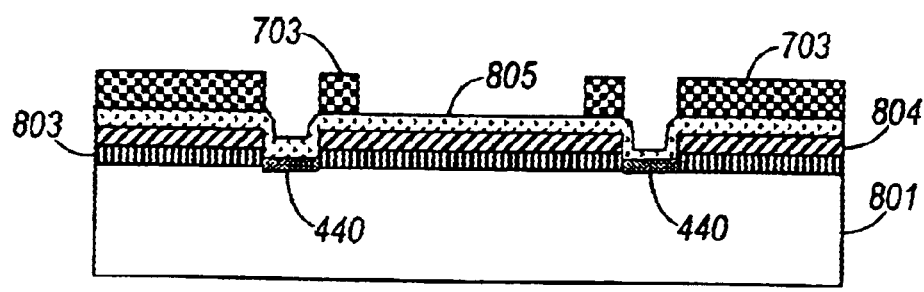
Figure 8G:
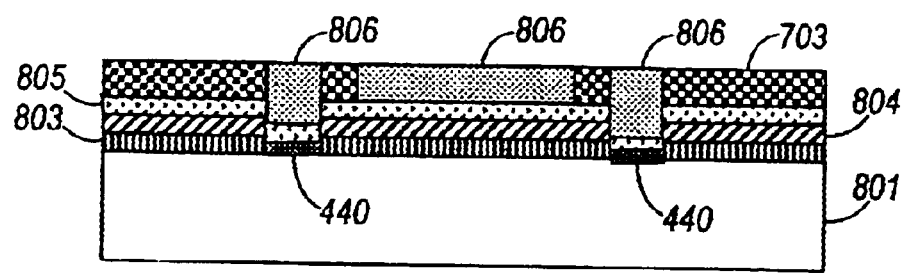
Figure 8H:
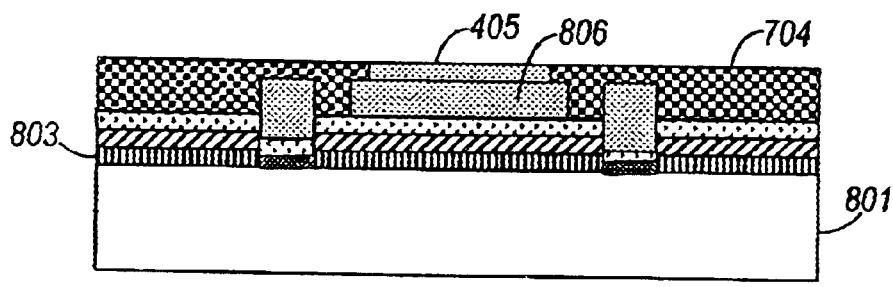
Figure 8I:
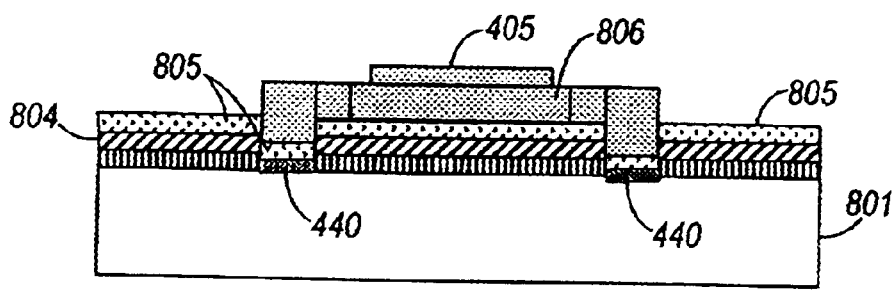

FIG. 8f shows electroplating mask 703 applied over copper layer 805 and patterned as shown in FIG. 7c in preparation for electroplating of nickel layer 806. Nickel layer 806 is electroplated over copper layer 805 to a typical thickness of about 1 μm as shown in FIG. 8g. Nickel layer 806 functions as a structural support layer for mirror 405 and suspension arms 450 (see FIGS. 4 and 9). Electroplating mask 703 is then removed. Electroplating mask 704 is applied and patterned as shown in FIG. 7d where only the area for mirror 405 is left exposed. Electroplating mask 704 is the mask for the nickel electroplating of mirror 405 to a typical thickness of about 2–3 μm as shown in FIG. 8h. Photoresist layer 704 is removed to produce the structure shown in FIG. 8i.

Figure 7E:
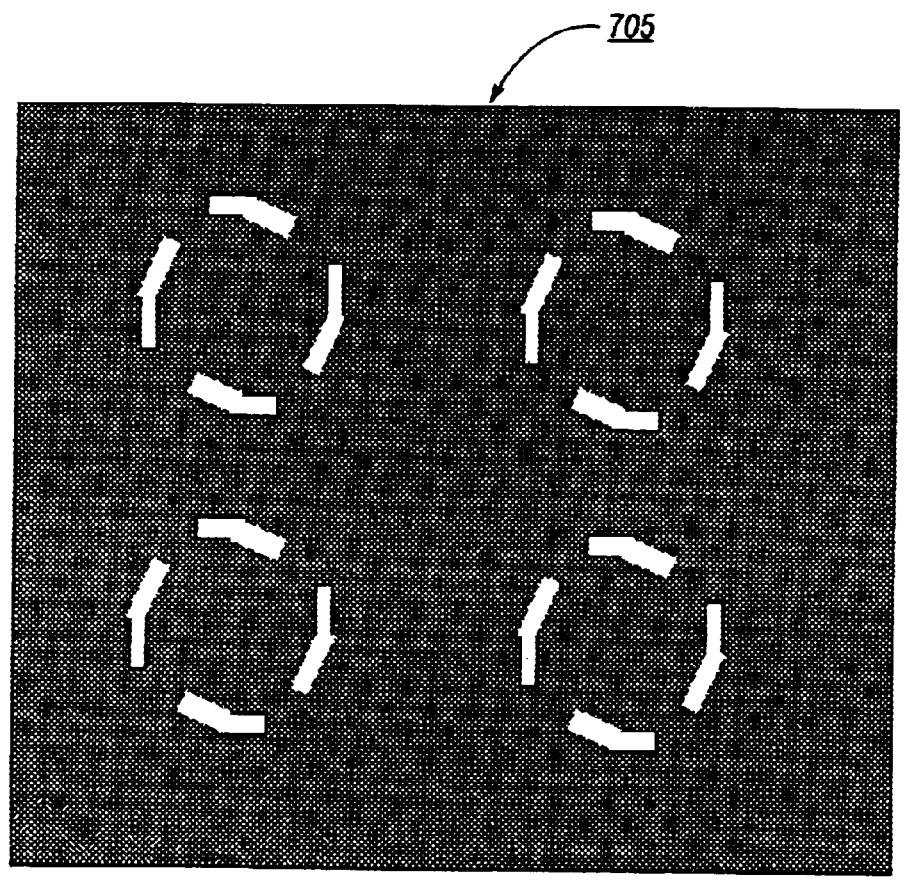
FIG. 7e shows a top view of a patterned mask used for processing.
Figure 8J:
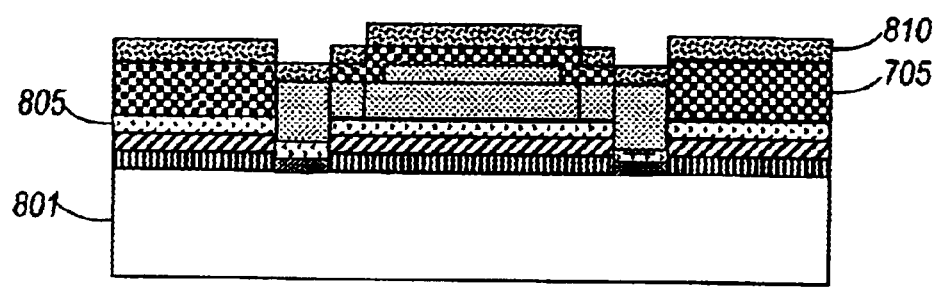

MoCr photoresist lift-off mask 705 is applied over mirror 405 and copper layer 805 as shown in FIG. 8j. Lift-off mask 705 is patterned as shown in FIG. 7e and then MoCr layer 810 is sputter deposited over lift-off mask 705. Typical sputter parameters for deposition of MoCr layer 810 are shown in Table 1 below and result in an internal stress gradient of about 3.0 Gpa across MoCr layer 810. Total lift can be designed using conventional micro-spring recipes such as disclosed in U.S. Pat. No. 5,914,218 which is incorporated by reference.

TABLE 1

| Sputter Deposition Conditions | | Time (sec) |
|---|---|---|
| Pressure: | 1.6 mT | 390 |
| Voltage: | 518 volts | |
| Current: | 1.13 A | |
| Pressure: | 2.2 mT | 330 |
| Voltage: | 470 volts | |
| Current: | 1.26 A | |
| Pressure: | 3.0 mT | 300 |
| Voltage: | 457 volts | |
| Current: | 1.30 A | |
| Pressure: | 3.9 mT | 330 |
| Voltage: | 453 volts | |
| Current: | 1.31 A | |
| Pressure: | 5.0 mT | 300 |
| Voltage: | 457 volts | |
| Current: | 1.30 A | |

Figure 8K:
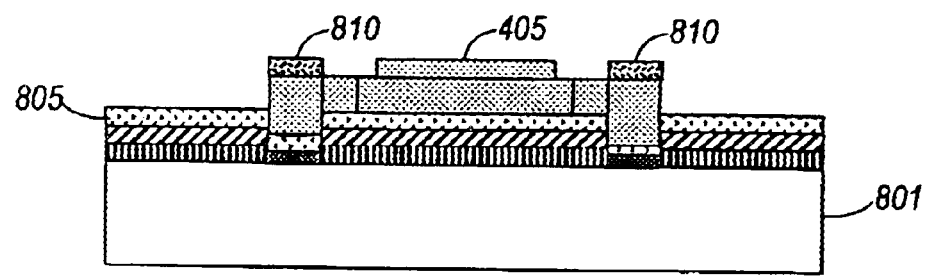
Figure 8L:
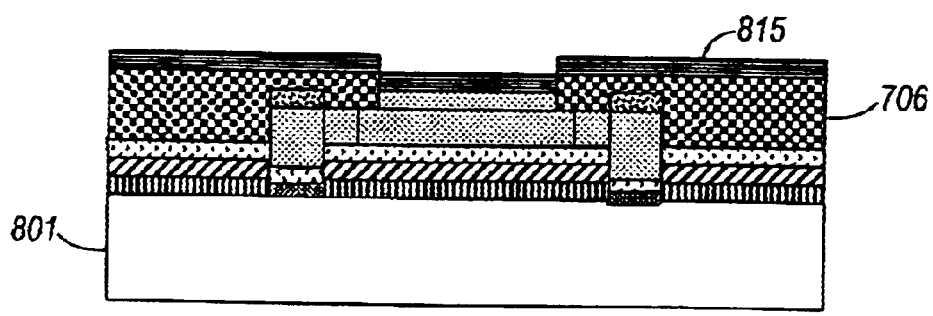

An acetone soak is performed to remove lift-off mask 705 and portions of MoCr layer 810 overlying lift-off mask 705 resulting in the structure shown in FIG. 8k.

Figure 7F:
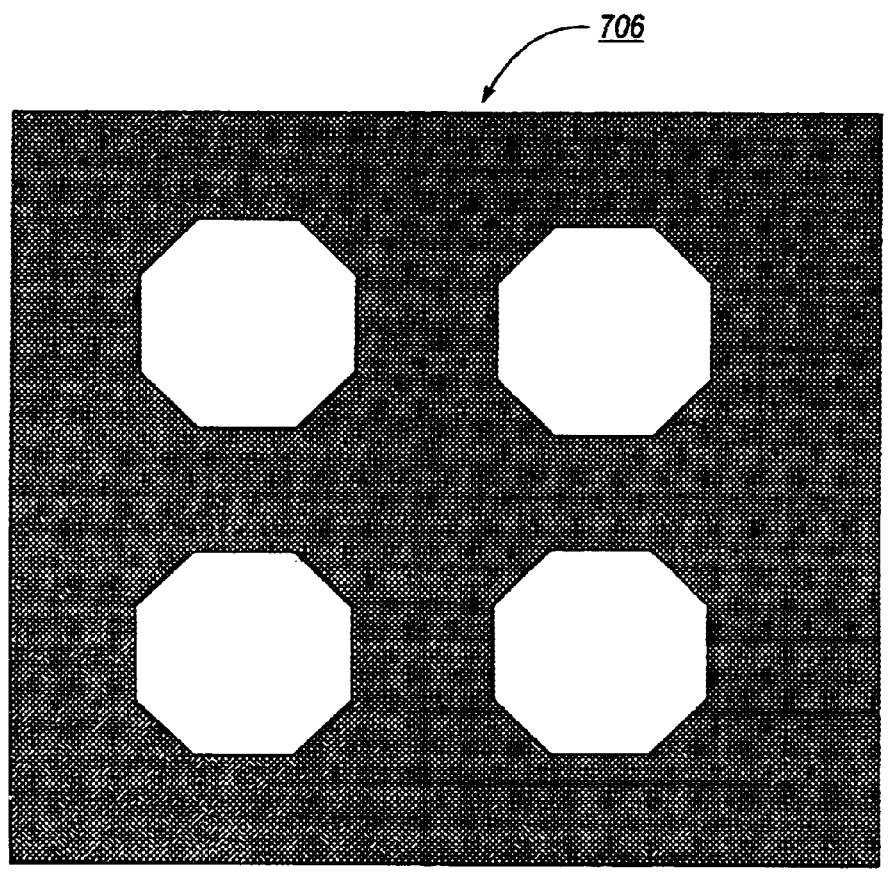
FIG. 7f shows a top view of a patterned mask used for processing.
Figure 8M:
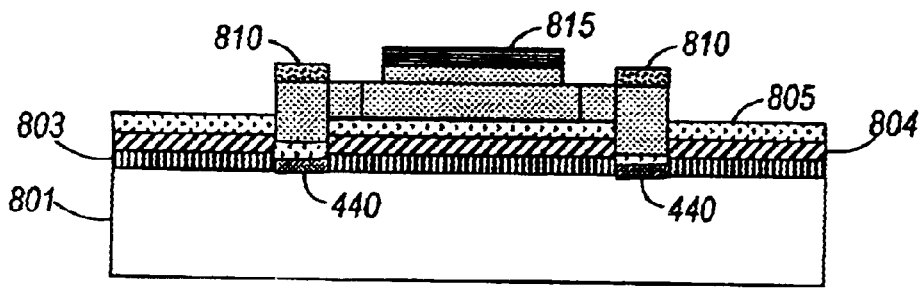

Photoresist lift-off mask 706 is applied over exposed copper layer 805, exposed nickel layer 806 and remaining portion of MoCr layer 810. Lift-off mask 706 is patterned as shown in FIG. 7f to expose only the surface of mirror 405. Gold layer 815 is then sputter deposited to coat mirror 405 with gold. After gold layer 815 has been deposited, lift-off mask 706 along with the portion of gold layer 815 overlying lift-off mask 706 is removed using an acetone soak. The resulting structure is shown in FIG. 8m. To make the structure shown in FIG. 8n, exposed copper layer 805 is removed using an alkaline etch, typically a mix of $5H_2O:5NH_4OH:H_2O_2$. This etch avoids damaging the exposed nickel.

Figure 8N:
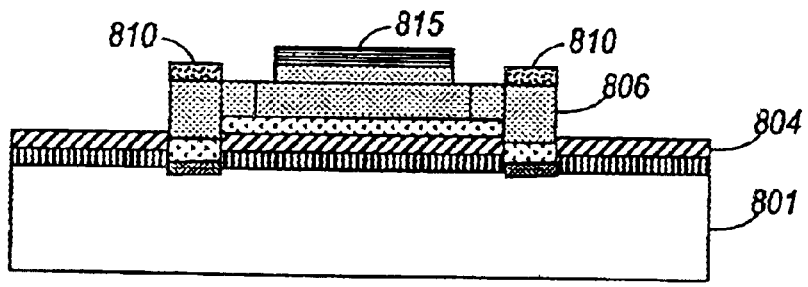
Figure 8O:
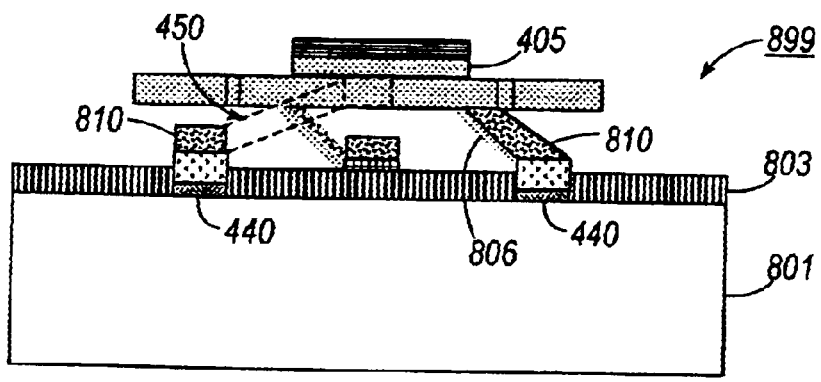
Figure 9:
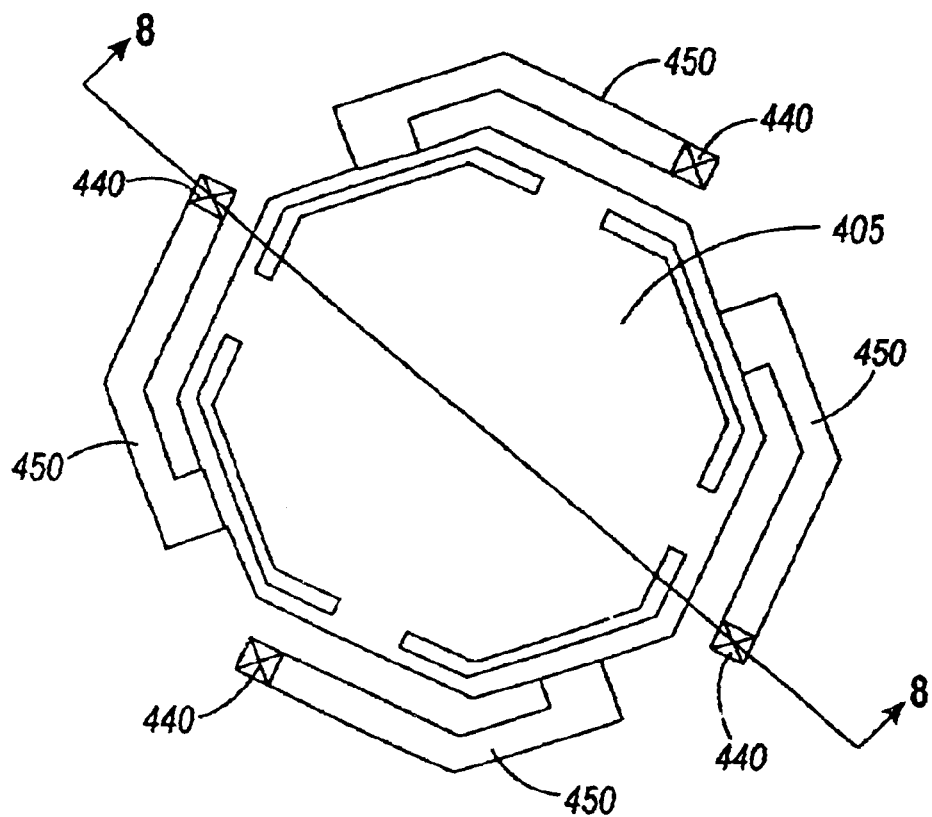
FIG. 9 shows a top view of an embodiment in accordance with the invention.
Figure 10:
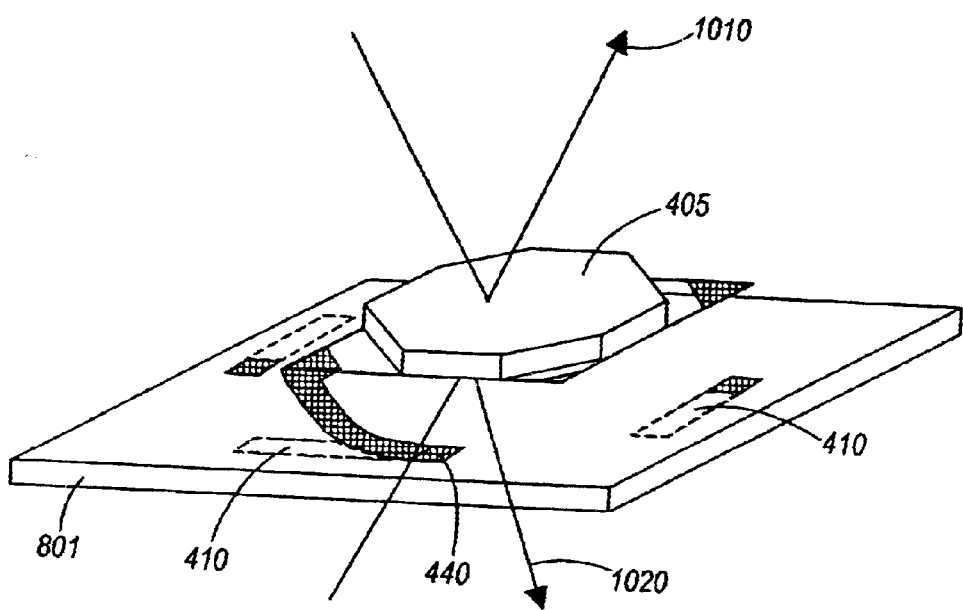
FIG. 10 shows a side view of an embodiment in accordance with the invention.

Finally, the structure shown in FIG. 8n is released using xenon difluoride (XeF$_2$) which removes sacrificial amorphous silicon layer 804. Note that remainder of copper layer 805 remains attached to structure 899. Removal of amorphous silicon layer 804 causes release of structure 899 as shown in FIG. 8o. Structure 899 raises up from substrate 801 due to the internal stress gradient in MoCr layer 810. Since MoCr layer 810 is the surface layer for suspension arms 450 (see also FIG. 4), the internal stress gradient in MoCr layer 810 acts to force up all four of suspension arms 450, thereby raising mirror 405. FIG. 10 shows a partial cut-away view of MEMS tilt mirror 106 on glass substrate 801. FIG. 10 shows a partial cut-away view of MEMS tilt mirror 106 on glass substrate 801 and showing optical beams 1010 and 1020. Optical beam 1020 reaches mirror 405 by passing through glass substrate 801.

Figure 11A:
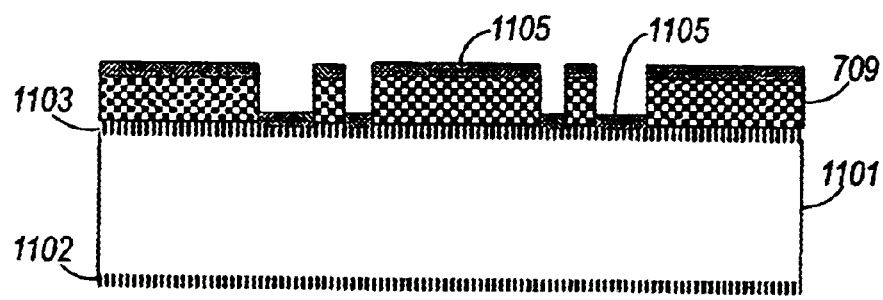
FIGS. 11a–11k show the processing steps in accordance with an embodiment of the invention.

FIGS. 11a–11k show the fabrication steps for two dimensional array 104 of MEMS tilt mirrors 106 using bulk silicon as the substrate in accordance with an embodiment of the invention. Typical thickness for bulk silicon substrate 1101 is on the order of 100 μm to facilitate etching. FIGS. 11a–11k are cross-sectional views along line 12—12 in FIG. 12. FIG. 11a shows bulk silicon substrate 1101 with dielectric, typically Si$_3$N$_4$, layers 1102 and 1103 deposited on two sides of bulk silicon substrate 1101. Photoresist lift-off mask 709 is applied over dielectric layer 1103 and patterned as shown in FIG. 7i. Cr layer 1105 is then sputter deposited over lift-off mask 709 and exposed dielectric layer 1103. Subsequently, lift-off mask 709 and overlying portions of Cr layer 1105 are removed using an acetone soak.

Figure 11B:
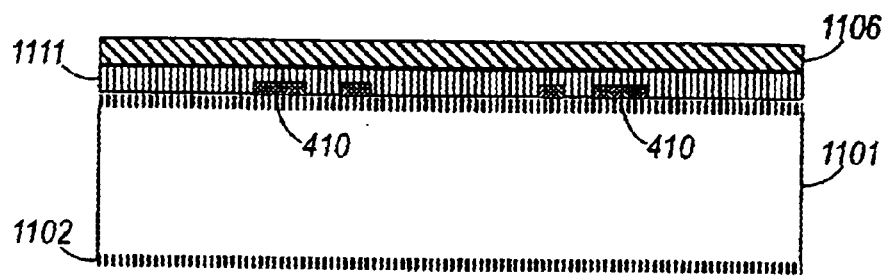
Figure 11C:
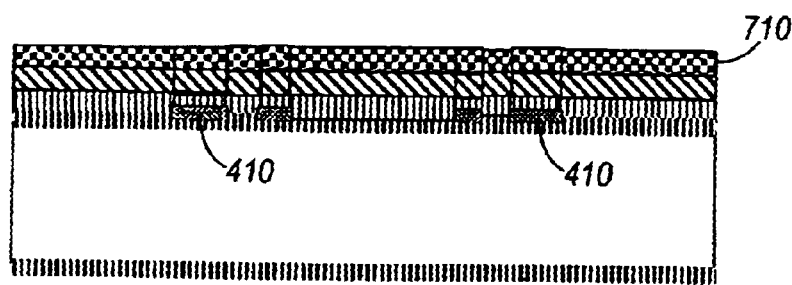
Figure 11D:
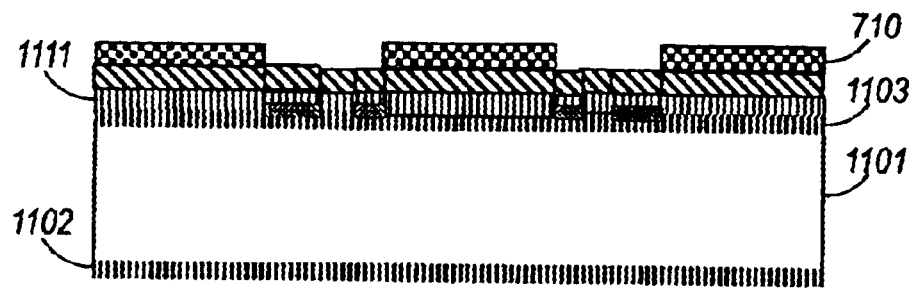
Figure 11E:
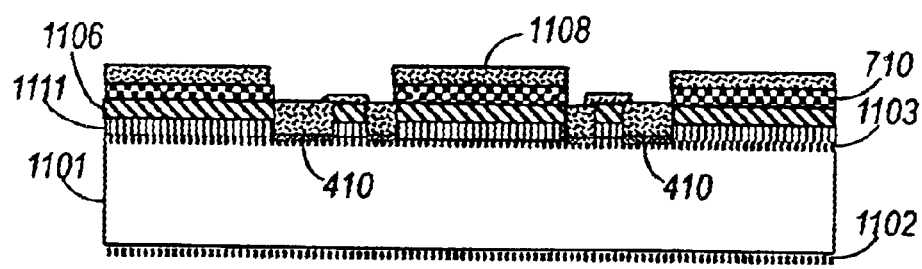
Figure 12:
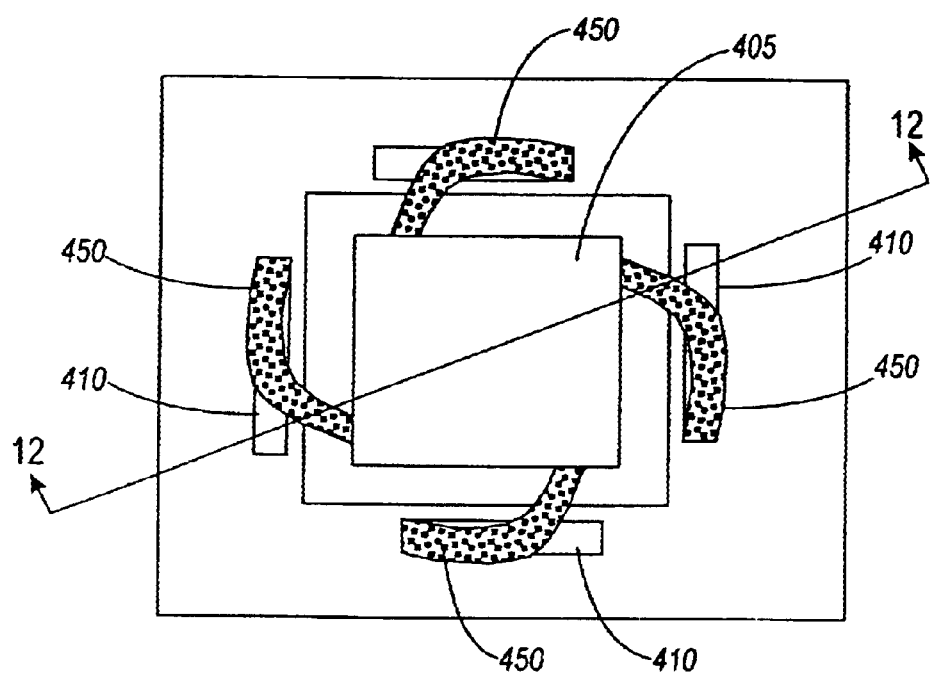
FIG. 12 shows a top view of an embodiment in accordance with the invention.

Following the acetone soak, FIG. 11b shows the deposition of dielectric layer 1111 over electrodes 410 to electrically isolate electrodes 410. Dielectric layer 1111 may be Si$_3$N$_4$ or another dielectric material. SiO$_2$ layer 1106 is deposited over dielectric layer 1111 for release purposes. FIG. 11c shows photoresist mask layer 711 applied over SiO$_2$ layer 1106 and then patterned as shown in FIG. 7k. Exposed portions of dielectric layer 1111 and SiO$_2$ layer 1106 are then dry etched away. Photoresist lift-off mask layer 710 is applied in FIG. 11d and patterned as shown in FIG. 7j. As shown in FIG. 11e, MoCr layer 1108 is sputter deposited to a typical thickness of about 500 nm over mask layer 710 as detailed in Table 1 above.

Figure 11F:
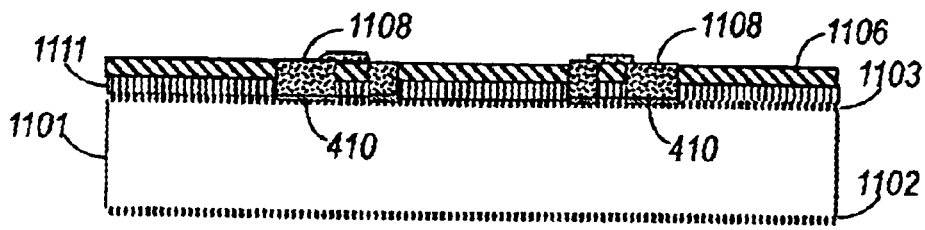
Figure 11G:
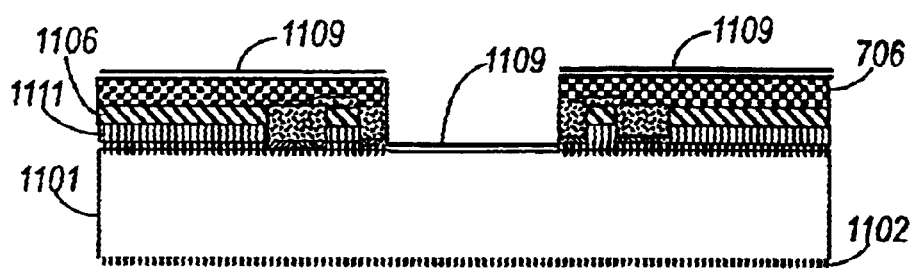
Figure 11H:
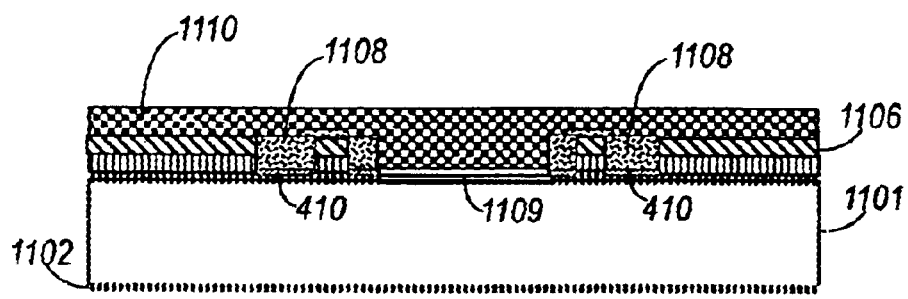

Photoresist lift-off mask 710 and overlying portions of MoCr layer 1108 are removed using an acetone soak to achieve the structure in FIG. 11f. FIG. 11g shows photoresist lift-off mask layer 708 applied over dielectric layer 1106 and MoCr layer 1108 and then patterned as shown in FIG. 7h. Gold layer 1109 is sputter deposited over photoresist lift-off mask layer 708 to a typical thickness of about 100 nm. Photolift-off mask layer 708 along with overlying portions of gold layer 1109 are then removed using an acetone soak. The entire top of the structure is covered with photoresist layer 1110 to a thickness of about 5–10 μm as shown in FIG. 11h and hard baked for about 20 minutes at approximately 120° C. to protect the top of the structure against subsequent processing steps.

Figure 7G:
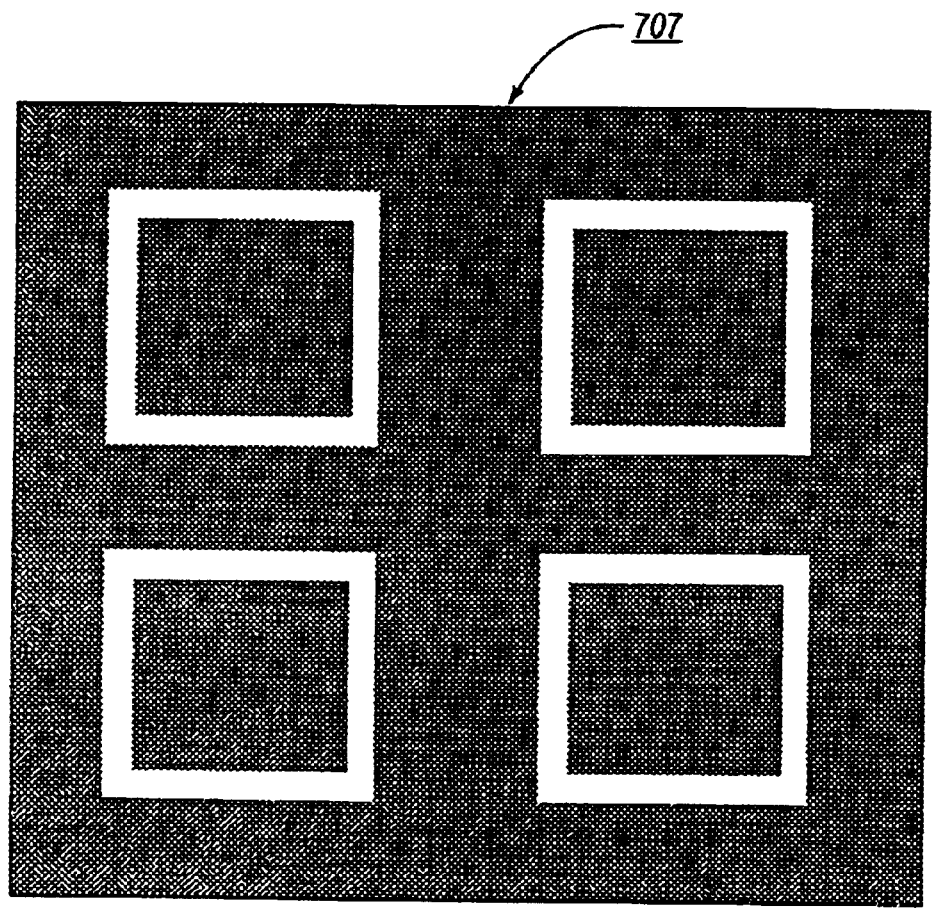
FIG. 7g shows a top view of a patterned mask used for processing.
Figure 7H:
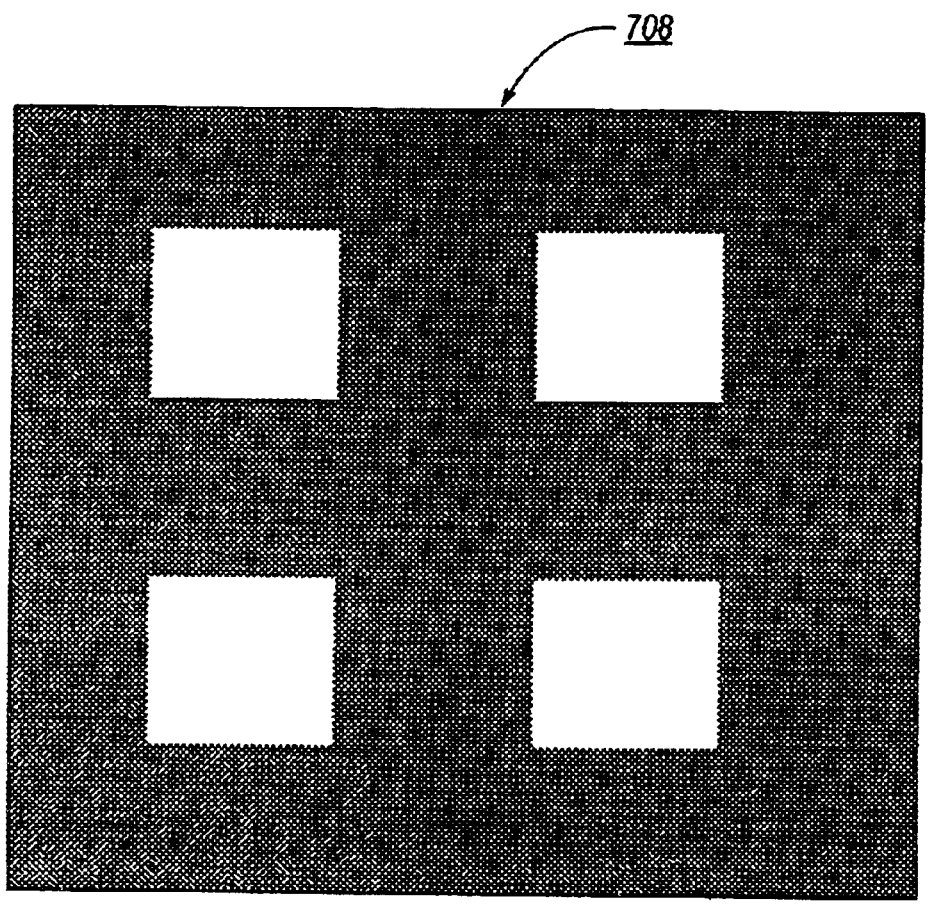
FIG. 7h shows a top view of a patterned mask used for processing.
Figure 7I:
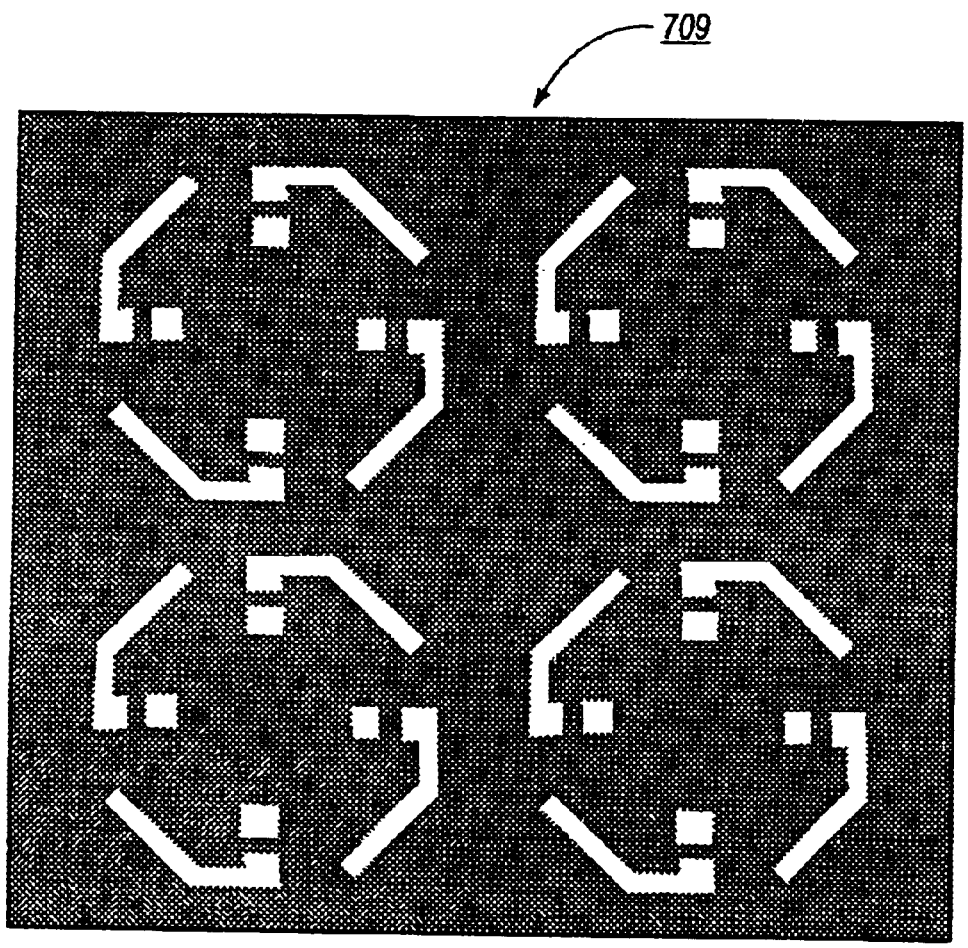
FIG. 7i shows a top view of a patterned mask used for processing.
Figure 7J:
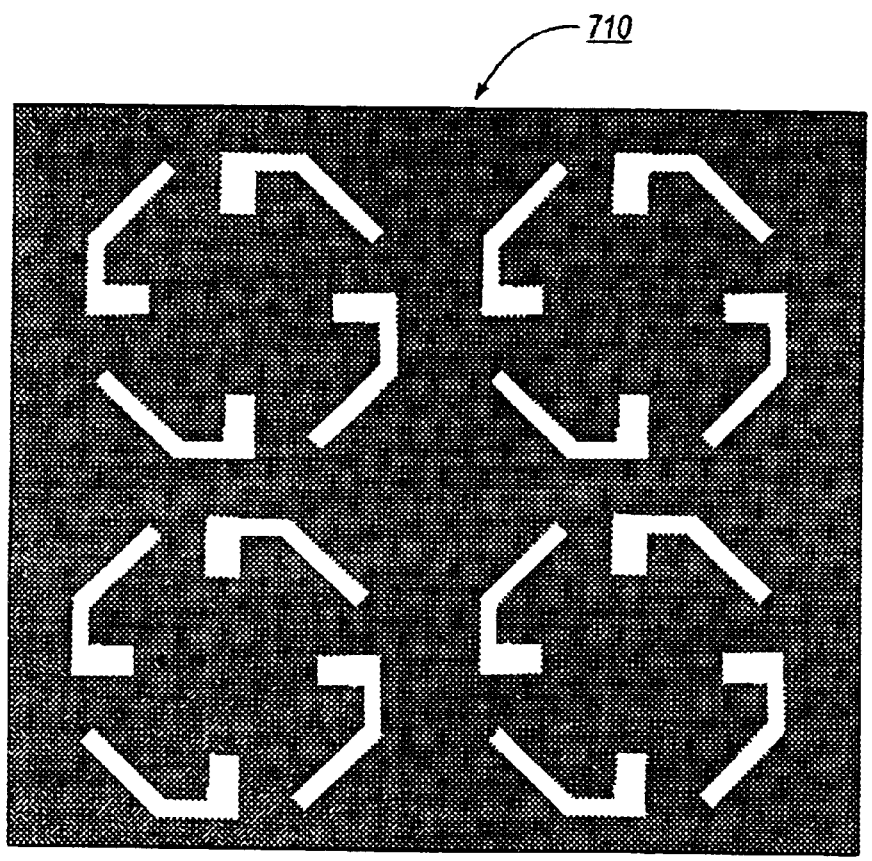
FIG. 7j shows a top view of a patterned mask used for processing.
Figure 7K:
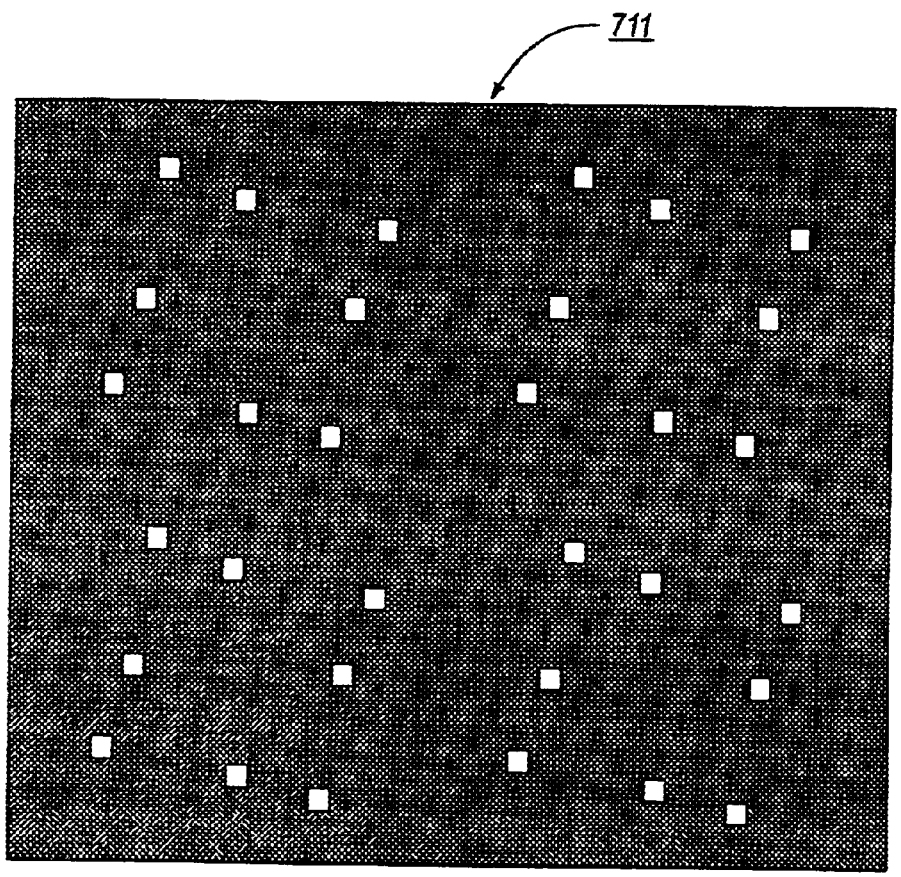
FIG. 7k shows a top view of a patterned mask used for processing.
Figure 71:
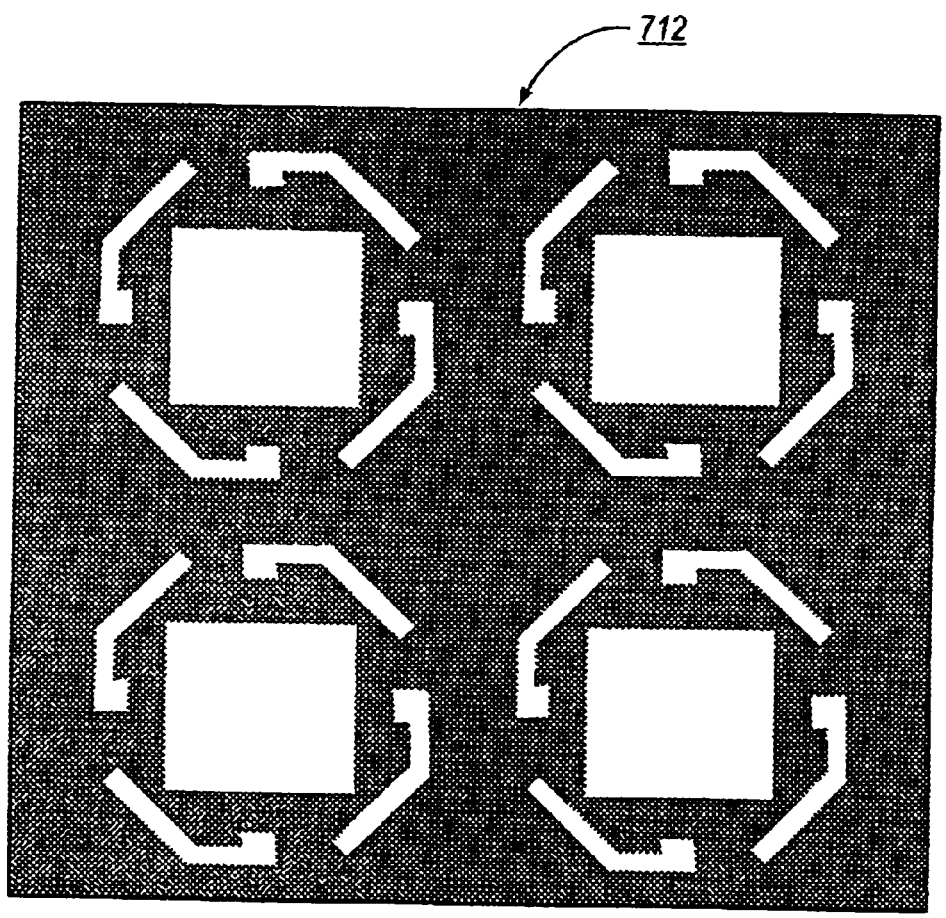
Figure 11I:
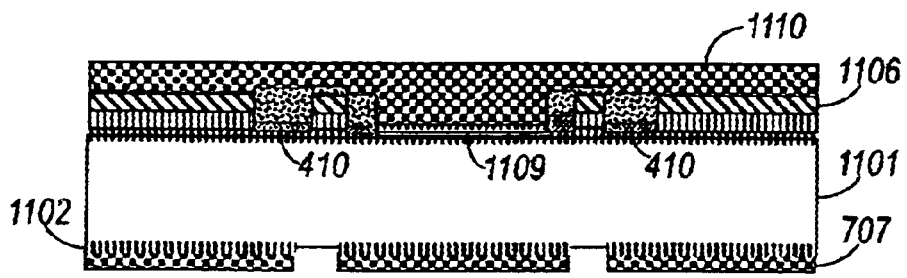
Figure 11J:
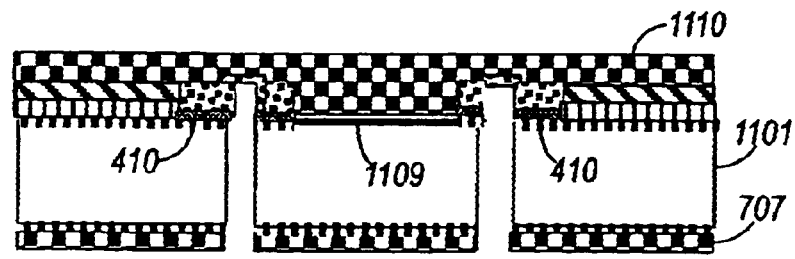
Figure 11K:
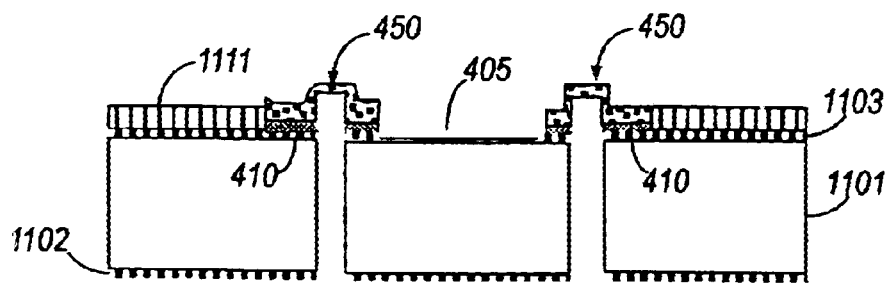
Figure 13:
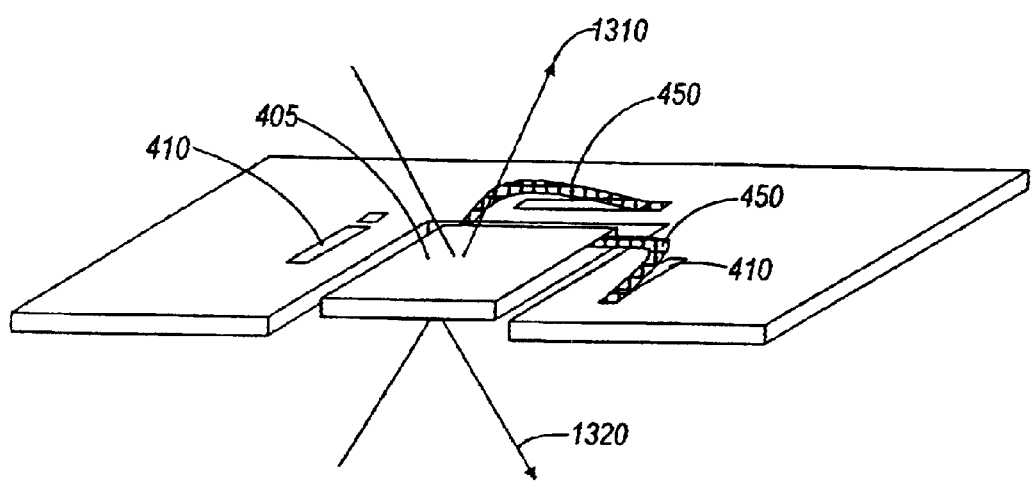
FIG. 13 shows a side view of an embodiment in accordance with the invention.

With reference to FIG. 11i, photoresist mask 707 is applied to dielectric layer 1102 and patterned as shown in FIG. 7g. Photoresist mask 707 exposes the areas for the deep reactive ion etch (DRIE) which removes the exposed sections of dielectric layer 1102 and overlying bulk silicon substrate 1101, dielectric layer 1103 and dielectric layer 1106 to form suspended mirror 405. FIG. 11j shows the extent of the deep reactive ion etch. MoCr suspension arms 450 (see FIG. 4) are also released from dielectric layer 1106. Finally, as shown in FIG. 11k, photoresist mask layers 707 and 1110 are removed using either a dry etch or an acetone soak followed by an etch in a photoresist stripper. Finished MEMS tilt mirror structure is shown in FIG. 13 where arrows 1310 and 1320 indicate that the bottom as well as the top surface of mirror 405 may be used to reflect light if minor changes are made to the processing steps 11a–11j so that the bottom of mirror 405 is also coated with gold.

Figure 14A:
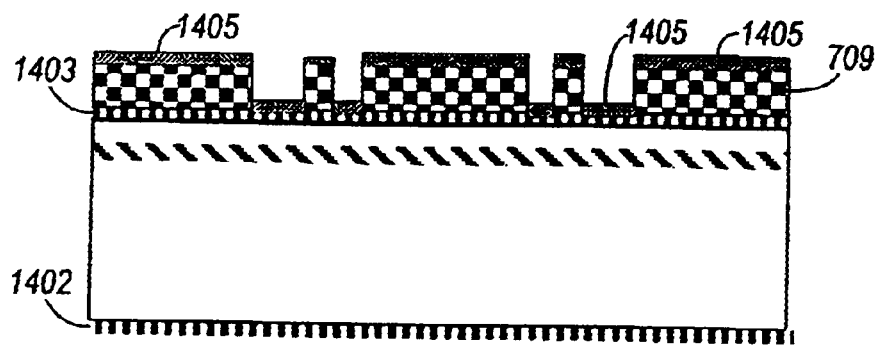
FIGS. 14a–14l show the processing steps in accordance with an embodiment of the invention.
Figure 14B:
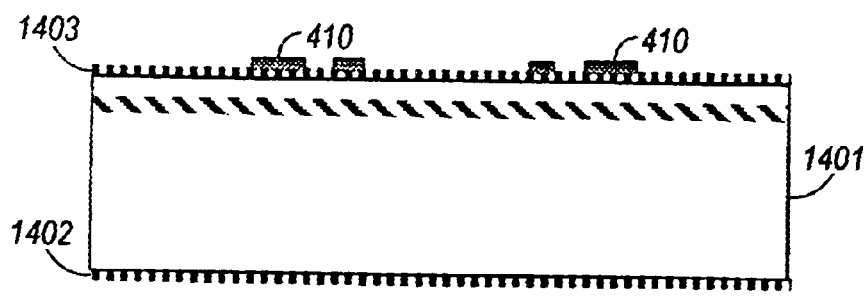
Figure 14C:
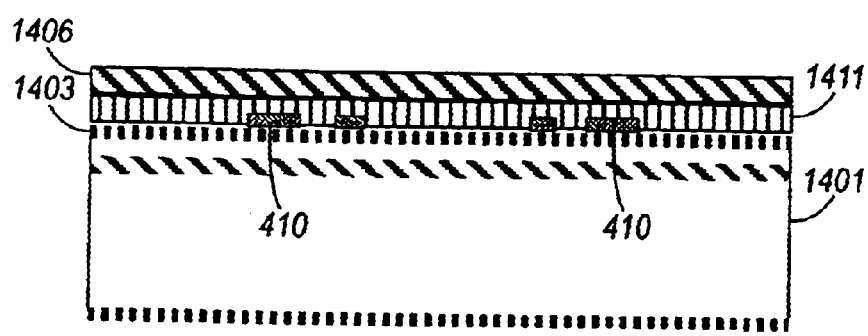
Figure 14D:
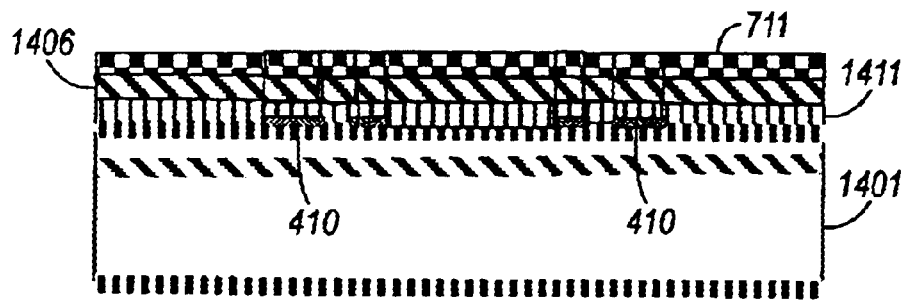
Figure 14E:
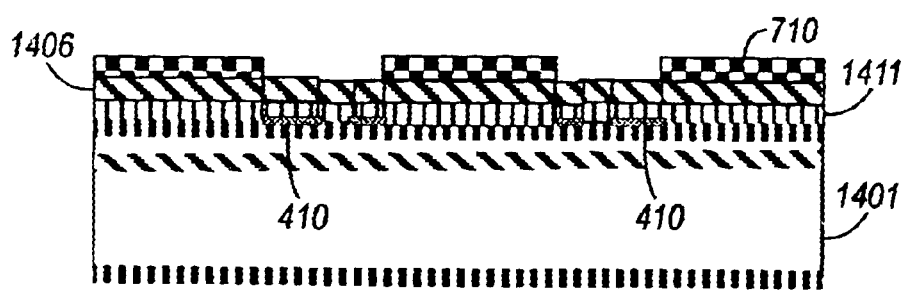
Figure 14F:
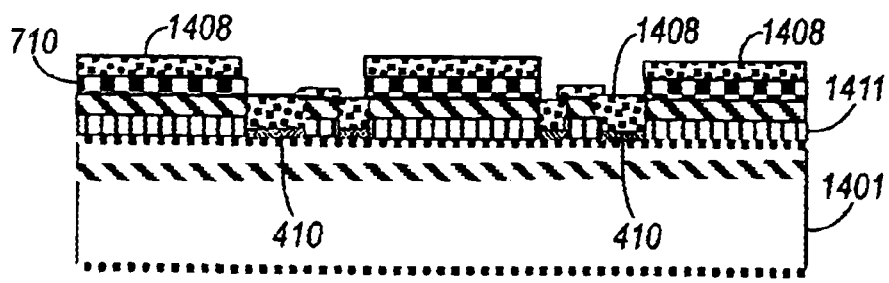

FIGS. 14a–14l show the fabrication steps for two dimensional array 104 of MEMS tilt mirrors 106 using a silicon on insulator substrate in accordance with an embodiment of the invention. FIGS. 14a–14l are cross-sectional views along line 12—12 in FIG. 12. FIG. 14a shows silicon on insulator substrate 1401 with dielectric, typically Si$_3$N$_4$, layers 1402 and 1403 deposited on two sides of silicon on insulator substrate 1401. Photoresist lift-off mask 709 is applied over dielectric layer 1403 and patterned as shown in FIG. 7i. Cr layer 1405 is sputter deposited to a typical thickness of about 100 nm over patterned photoresist lift-off mask 709. Photoresist lift-off mask 709 and overlying portions of Cr layer 1405 are removed using an acetone soak or other standard lift-off technique as shown in FIG. 14b. In FIG. 14c, dielectric layer 1411 is deposited over actuator electrodes 410 to electrically isolate electrodes 410. Dielectric layer 1411 may be Si$_3$N$_4$ or another dielectric material. Typically, porous SiO$_2$ layer 1406 is deposited over dielectric layer 1411 for release purposes. FIG. 14d shows photoresist mask layer 711 applied over SiO$_2$ layer 1406 and then patterned as shown in FIG. 7k. Exposed portions of SiO$_2$ layer 1406 and underlying portions of dielectric layer 1411 are then dry etched away. Photoresist lift-off mask layer 710 is applied over remaining portions of SiO$_2$ layer 1406 and exposed portions of layer 141 in FIG. 14e and patterned as shown in FIG. 7j. As shown in FIG. 14f, MoCr layer 1408 is sputter deposited to a typical thickness of about 500 nm over mask layer 710 as detailed in Table 1 above.

Figure 7M:
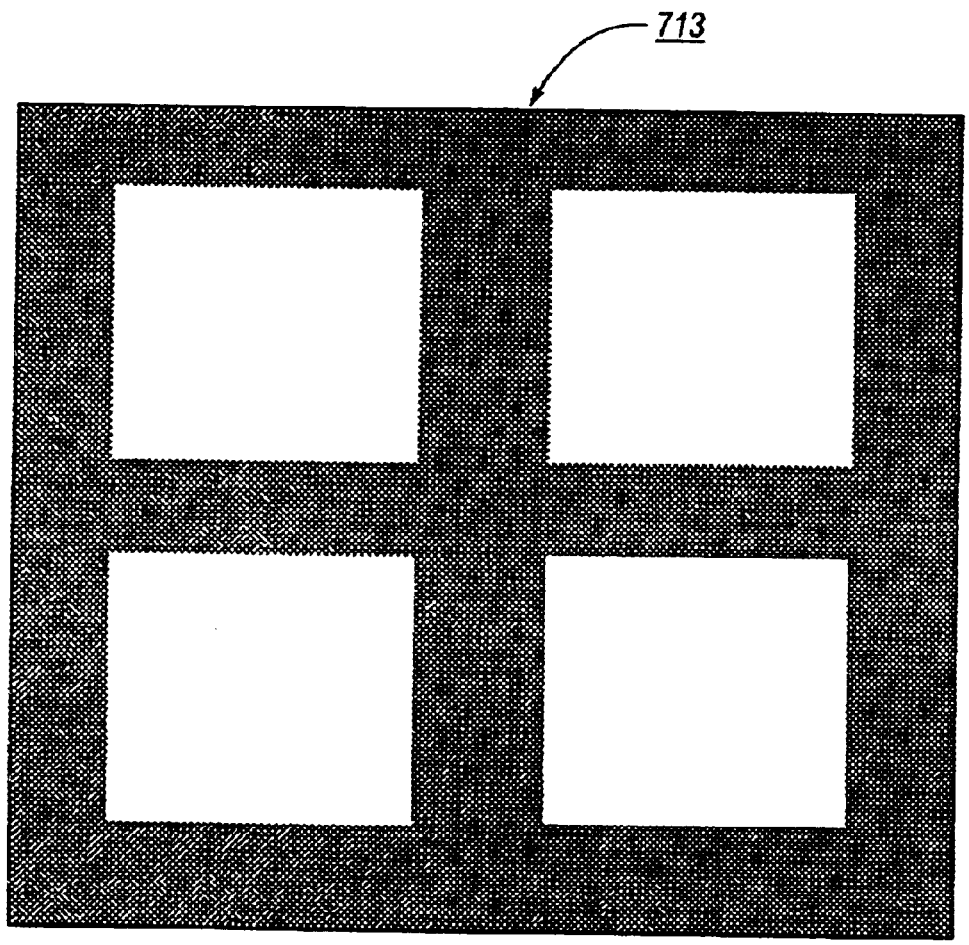
FIG. 7m shows a top view of a patterned mask used for processing.
Figure 14G:
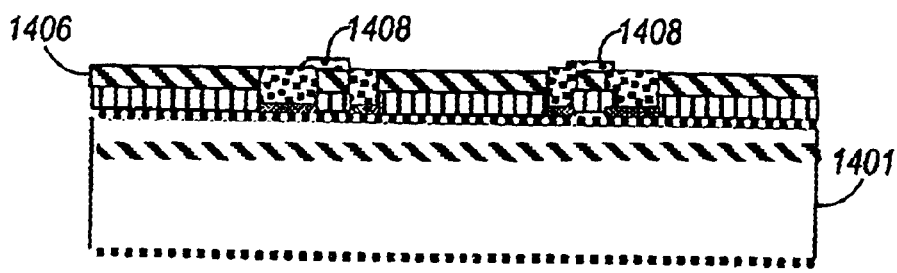
Figure 14H:
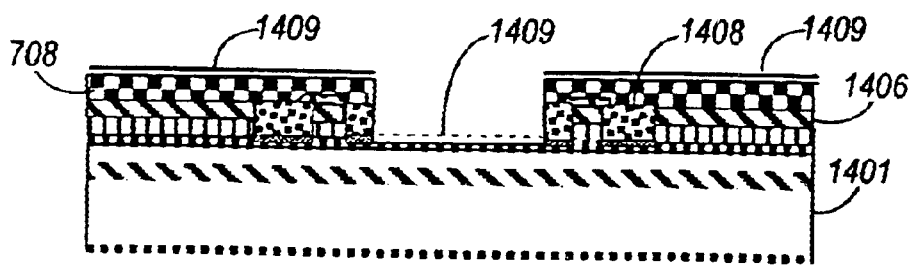
Figure 14I:
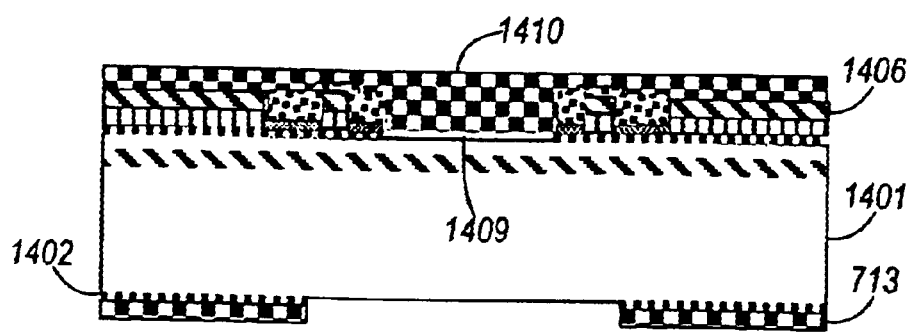

Photoresist lift-off mask 710 and overlying portions of MoCr layer 1408 are removed using an acetone soak or other lift-off technique to achieve the structure shown in FIG. 14g. FIG. 14h shows photoresist lift-off mask 708 applied over dielectric layer 1406 and MoCr layer 1408 and then patterned as shown in FIG. 7h. Gold layer 1409 is sputter deposited over photoresist lift-off mask layer 708 to a typical thickness of about 100 nm. Photoresist lift-off mask layer 708 along with overlying portions of gold layer 1409 are then removed using an acetone soak or other lift-off technique. The entire top of the structure is covered with photoresist layer 1410 to a thickness of about 5–10 nm as shown in FIG. 14i and hard baked for about 20 minutes at 120° C. to act as protection for subsequent processing steps. Photoresist mask layer 713 is applied over dielectric layer 1402 and patterned as shown in FIG. 7m. The exposed portion of dielectric layer 1402 is removed using a buffered hydrofluoric acid etch to allow for the following potassium hydroxide etch. Photoresist mask layer 713 is then also removed using an acetone soak.

Figure 14J:
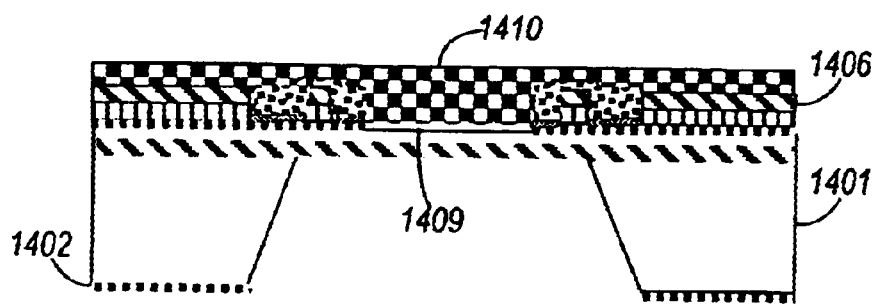
Figure 14K:
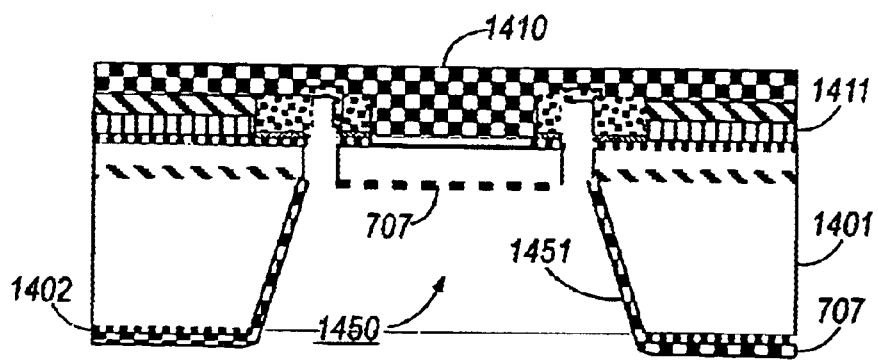
Figure 14L:
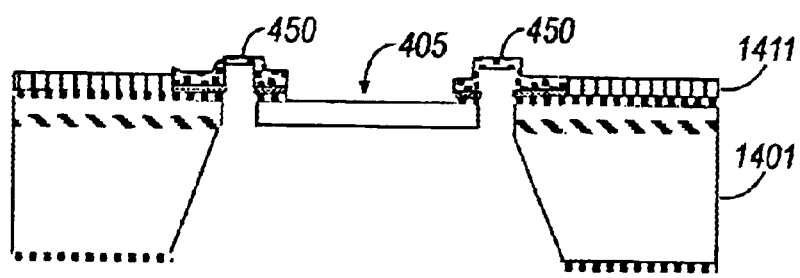
Figure 15:
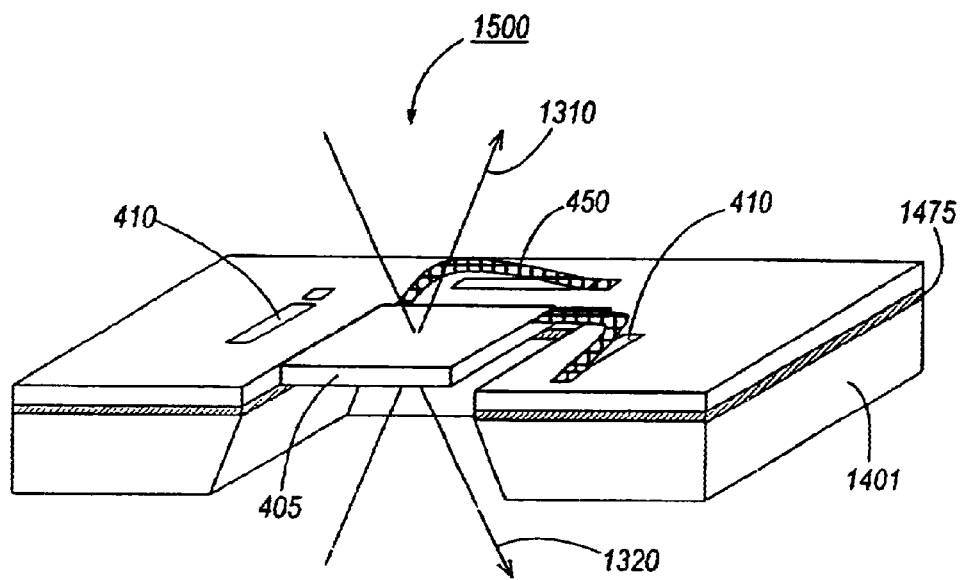
FIG. 15 shows a side view of an embodiment in accordance with the invention.

Silicon on insulator substrate 1401 is backside etched using a 45% potassium hydroxide solution at a temperature of approximately 60° C. until buried oxide layer 1475 is reached as shown in FIG. 14j. Buried oxide layer 1475 functions as an etch stop. Remaining portion of dielectric layer 1402 and exposed portion of buried dielectric layer 1475 are coated with photoresist mask 707 which is patterned as shown in FIG. 7g. Exposed sidewalls in cavity 1450 are also coated with photoresist layer 1451. The exposed areas are then deep reactive ion etched to remove the exposed portion of buried dielectric layer 1475 as well as the portions of silicon on insulator substrate 1401, dielectric layer 1403 and dielectric layer 1406 that lie over exposed portion of buried dielectric layer 1475. The resultant structure is shown in FIG. 14k. Finally, as shown in FIG. 11l, photoresist mask layers 707 along with photoresist layers 1410 and 1451 are removed using either a dry etch or an acetone soak followed by an etch in a photoresist stripper. Finished MEMS tilt mirror structure 1500 is shown in FIG. 15 where arrows 1510 and 1520 indicate that the bottom as well as the top surface of mirror 405 may be used to reflect light if minor changes are made to the processing steps 14a–14l so that the bottom of mirror 405 is coated with gold.

Figure 16A:
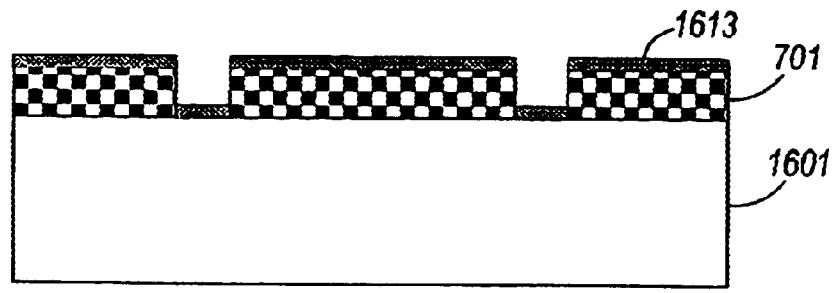
FIGS. 16a–16i show the processing steps in accordance with an embodiment of the invention.
Figure 16B:
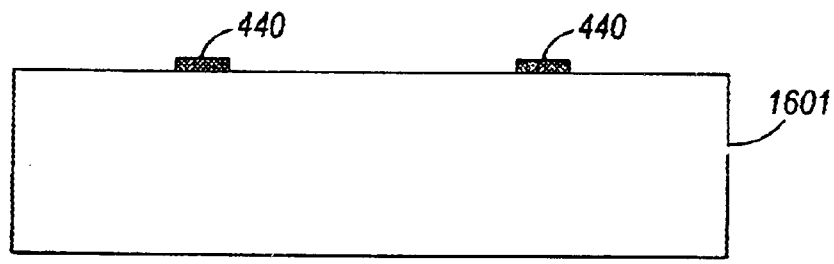
Figure 16C:
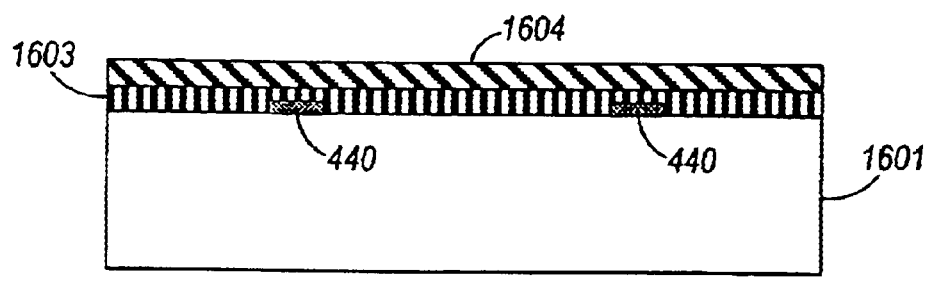

FIGS. 16a–16i show the fabrication steps for two dimensional array 104 of MEMS tilt mirrors 106 using any one of the previously mentioned substrates by using polysilicon as the mechanical mirror material in accordance with an embodiment of the invention. FIGS. 16a–16i are cross-sectional views along line 9—9 in FIG. 9. FIG. 16a shows application of photoresist lift-off mask layer 701 on substrate 1601. After application, lift-off mask layer 701 is patterned as shown in FIG. 7a for anchor points 440, actuation electrodes 410 and electrical contacts (not shown). Cr layer 1613 is deposited over lift-off mask layer 701 to a typical thickness of about 100 nm. FIG. 16b shows removal of photoresist lift-off mask layer 701 and the portion of Cr layer 1613 overlying photoresist lift-off mask 701 using an acetone soak or other lift-off technique leaving actuation electrodes 410 (see FIG. 4) and anchor points 440 in place. Using Low Pressure Chemical Vapor Deposition (LPCVD), $Si_3N_4$ layer 1603 is deposited to a typical thickness of about 200 nm over substrate 1601, anchor points 440 and actuation electrodes 410 (see FIG. 4) followed by deposition of porous $SiO_2$ layer 1604 over $Si_3N_4$ layer 1603 to a typical thickness of about 150 nm as shown in FIG. 16c.

Figure 16D:
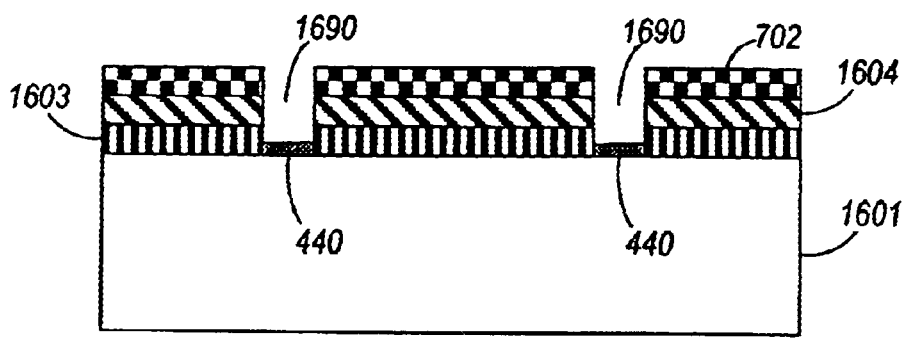
Figure 16E:
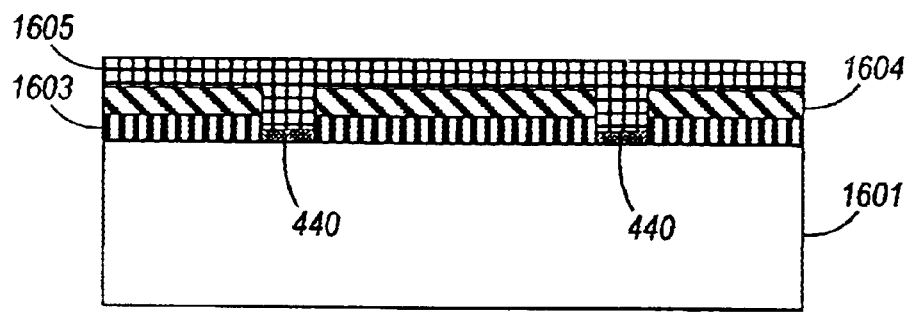
Figure 16F:
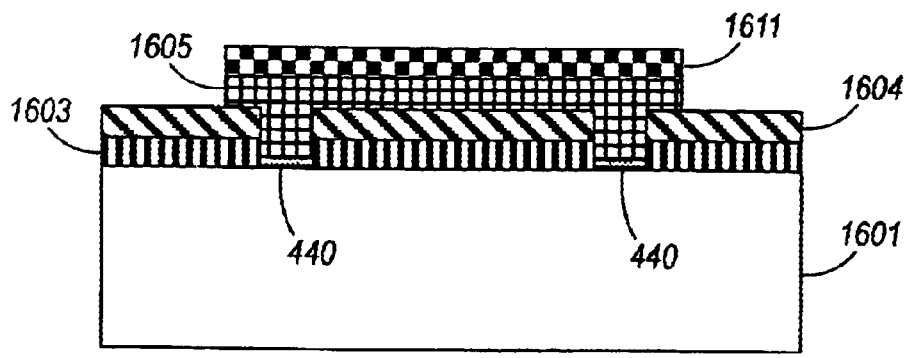

With reference to FIG. 16d, photoresist mask layer 702 is applied to $SiO_2$ layer 1604 and patterned as shown in FIG. 7b. Vias 1690 are dry etched using an $O_2/SF_6$ plasma down to anchor points 440 and electrical contacts (not shown). After removal of photoresist mask layer 702 using an acetone soak, polysilicon layer 1605 is deposited to a typical depth of about 6 $\mu$m to act as the mechanical layer for mirror 405. Then a chemical mechanical polish is applied to polysilicon layer 1605 to planarize the top surface of polysilicon layer 1605 resulting in the structure shown in FIG. 16e.

Figure 16G:
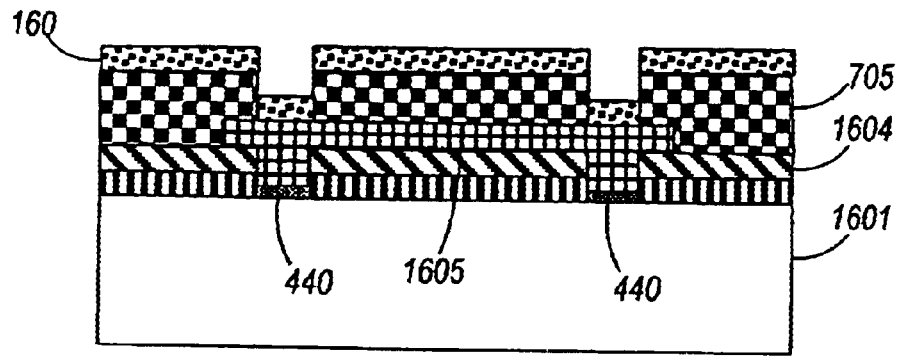

Photoresist mask layer 1611 is applied over polysilicon layer 1605 and patterned as the photo negative of photoresist mask 703 shown in FIG. 7c. Exposed portions of polysilicon layer 1605 are then dry etched away giving the structure in FIG. 16f. Photoresist mask layer 1611 is then removed using either an acetone soak or a dry etch. Photoresist lift-off mask layer 705 is then deposited over exposed $SiO_2$ layer 1604 and remaining polysilicon layer 1605. With reference to FIG. 16g, photoresist lift-off mask layer 705 is patterned as shown in FIG. 7e and then MoCr layer 1610 is sputter deposited to a typical thickness of about 500 nm on photoresist lift-off mask layer 705 and on exposed portions of polysilicon layer 1605 as described in Table 1. Photoresist lift-off mask layer 705 and overlying portions of MoCr layer 1610 are then removed using an acetone soak or other lift-off technique.

Figure 16H:
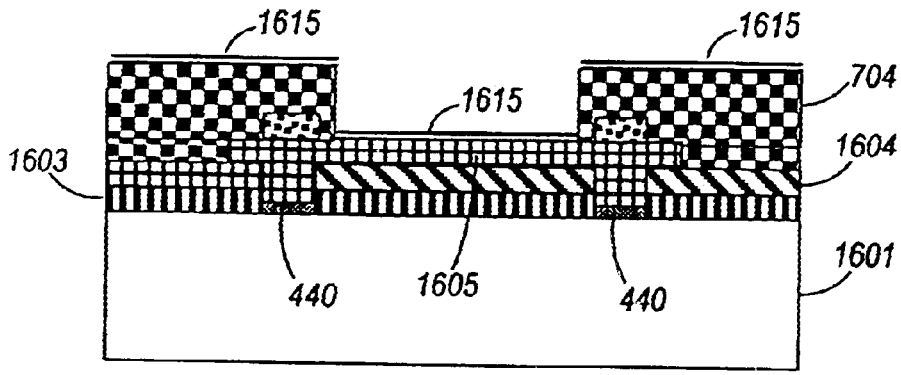
Figure 16I:
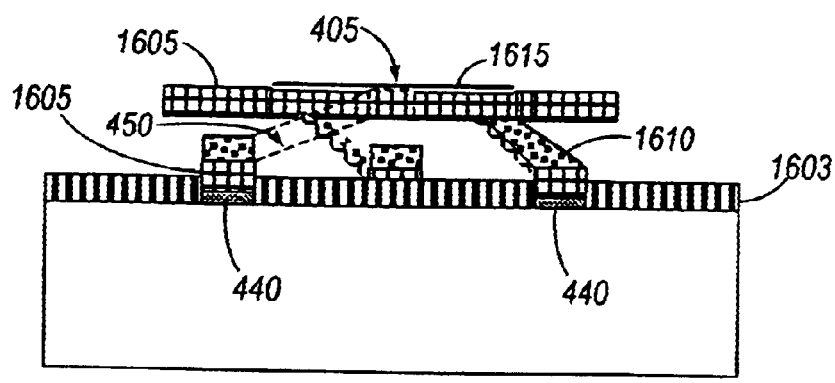

Photoresist lift-off mask layer 704 is applied over polysilicon layer 1605 and exposed portion of $SiO_2$ layer 1604 and patterned as shown in FIG. 7f. Gold layer 1615 is sputter deposited to a typical thickness of about 100 nm on photoresist lift-off mask layer 706 as shown in FIG. 16h. Then photoresist lift-off mask 706 and overlying gold layer 1615 is removed using an acetone soak or other lift-off technique leaving gold layer 1615 on mirror 405. Finally, a wet etch is performed on porous $SiO_2$ layer using forty nine percent hydrofluoric acid for about 15 minutes to release mirror 405 as shown in FIG. 16i. The resulting structure is similar to that shown in the partial cutaway of FIG. 10.

Figure 17A:
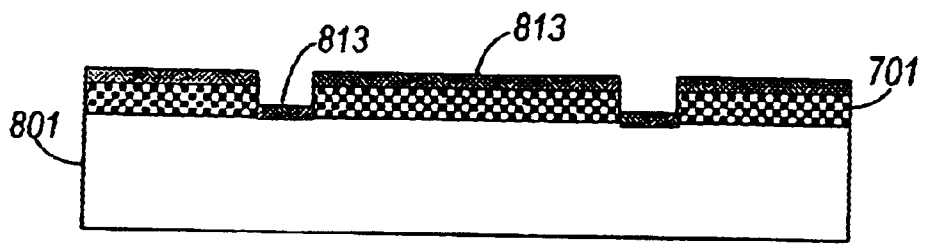
FIGS. 17a–17l show the processing steps in accordance with an embodiment of the invention.
Figure 17B:
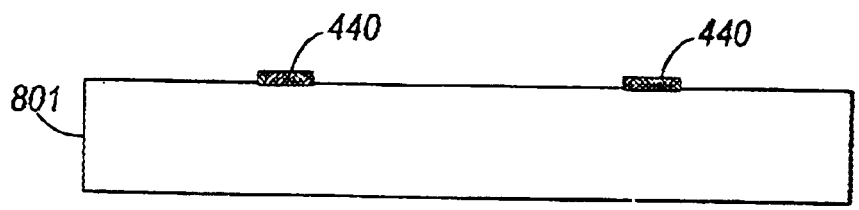
Figure 17C:
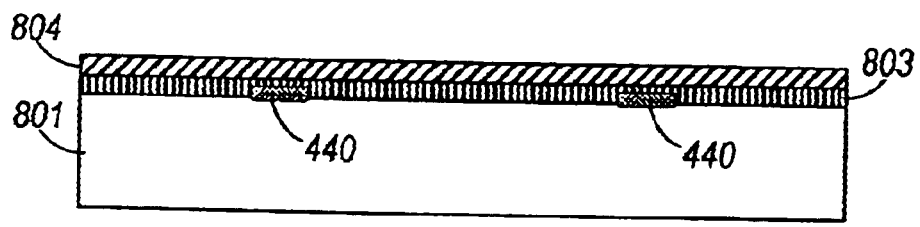

Tilt mirror 106 flatness can be achieved by making tilt mirrors 106 from two adjacent stress metal layers with opposite stress gradients. FIGS. 17a–17l show the fabrication steps for two dimensional array 104 of MEMS tilt mirrors 106 using glass as the substrate in accordance with an embodiment of the invention to produce opposing stress. FIGS. 17a–17m are cross-sectional views taken substantially along line 8—8 in FIG. 9. High quality unannealed glass substrate 801 is cleaned prior to application of photoresist lift-off mask 701. After application, lift-off mask 701 is patterned as shown in FIG. 17a for anchor points 440, actuation electrodes 410 and electrical contacts (not shown). Typically, 100 nm of chromium 813 is sputter deposited over lift-off mask 701. FIG. 17b shows removal of photoresist lift-off mask 701 and the portion of chromium layer 813 overlying photoresist lift-off mask 701 using an acetone soak and leaving actuation electrodes 410 (see FIG. 4) and anchor points 440 in place. Using low pressure chemical vapor deposition (LPCVD), $Si_3N_4$ layer 803 having a typical thickness of about 150 nm is deposited over glass substrate 801, over actuation electrodes 410 (see FIG. 4) and anchor points 440 as shown in FIG. 17c.

Figure 17D:
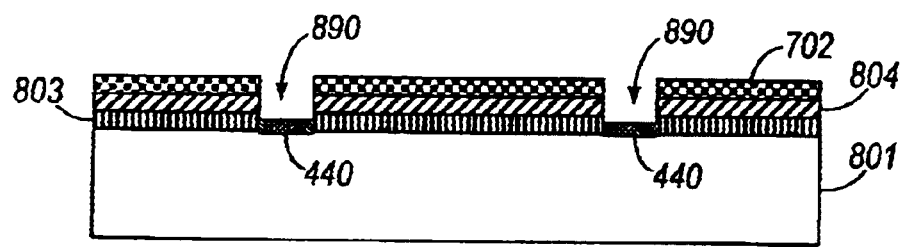
Figure 17E:
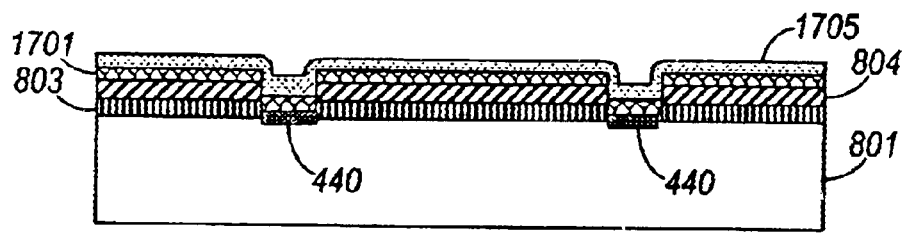

With reference to FIG. 17d, amorphous silicon layer 804 is LPCVD deposited over $Si_3N_4$ layer 803 to a typical thickness of about 500 nm. Photoresist mask 702 is applied over amorphous silicon layer 804 and patterned as shown in FIG. 7b. Vias 890 are dry etched using an $O_2/SF_6$ plasma down to anchor points 440 and electrical contacts (not shown). After removal of photoresist mask 702 using an acetone soak, titanium adhesion layer 1701 is deposited to a typical thickness of about 50 nm over amorphous silicon layer 804, electrical contacts (not shown) and anchor points 440 and followed by deposition of gold reflective layer 1705 over titanium adhesion layer 1701 as shown in FIG. 17e.

Figure 17F:
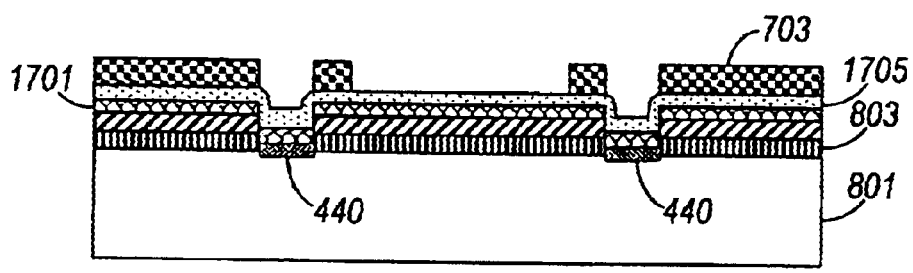
Figure 17G:
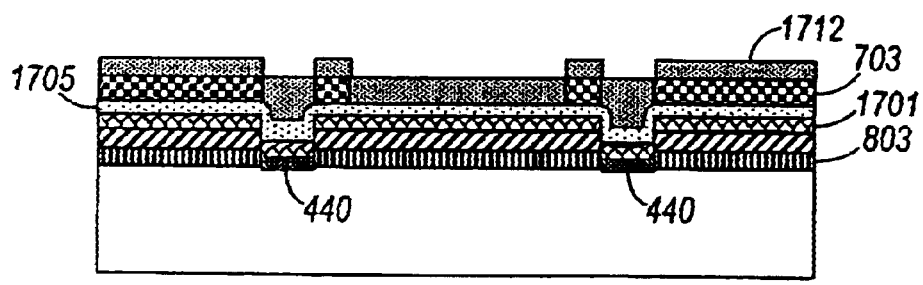

FIG. 17f shows lift-off mask 703 applied over gold reflective layer 1705 and patterned as shown in FIG. 7c in preparation for deposition of MoCr layer 1710. FIG. 17g shows sputter deposition of five sublayers of MoCr, resulting in a typical total MoCr layer 1712 thickness of 1 $\mu$m. Typical sputter parameters for deposition of MoCr layer 1712 are shown in Table 1 above and result in MoCr layer 1712 having an internal stress gradient of about 3.0 Gpa.

Figure 17H:
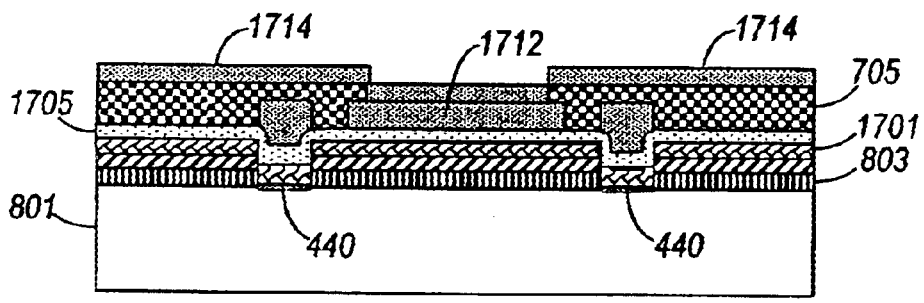
Figure 17I:
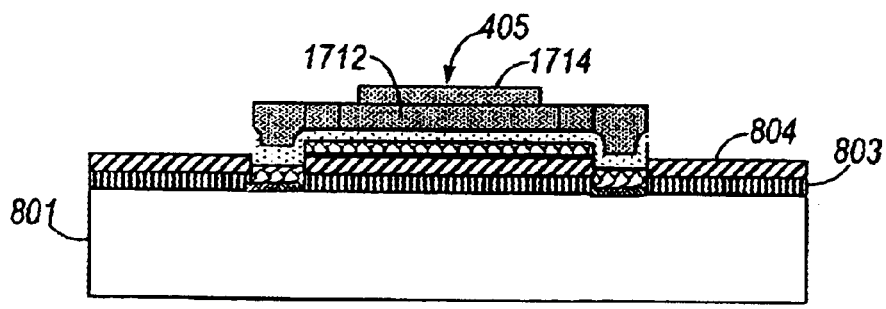

Photoresist lift-off mask 704 is applied over MoCr layer 1712. Lift-off mask 704 is patterned as shown in FIG. 7d leaving only the mirror area exposed. Then MoCr layer 1714 is sputter deposited over lift-off mask 704 with a designed in stress gradient opposite to that of MoCr layer 1712 as shown in FIG. 17h. This results in substantially zero net force in mirror 405. An acetone soak is performed to remove lift-off mask 704 and portions of MoCr layer 1714 overlying lift-off mask 704. Exposed portion of gold reflective layer 1705 is removed using TRANSENE gold etchant followed by a mixture of $HF:H_2O$ to remove the exposed portion of titanium adhesion layer 1712 as shown in FIG. 17i.

Figure 17J:
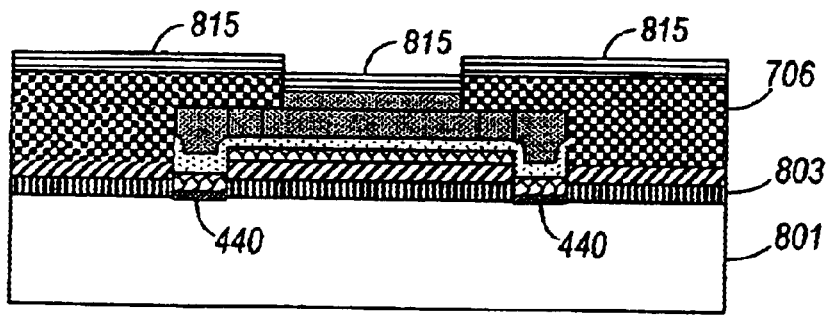
Figure 17K:
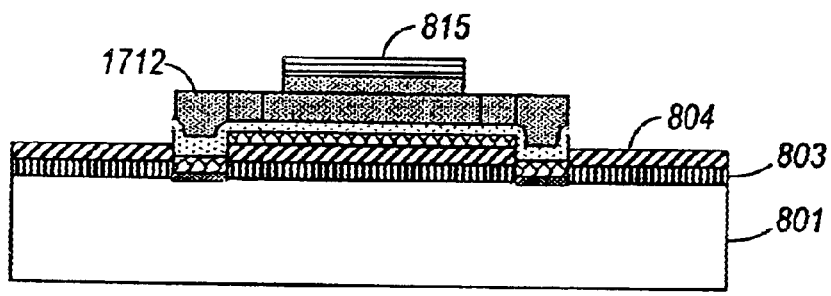
Figure 17L:
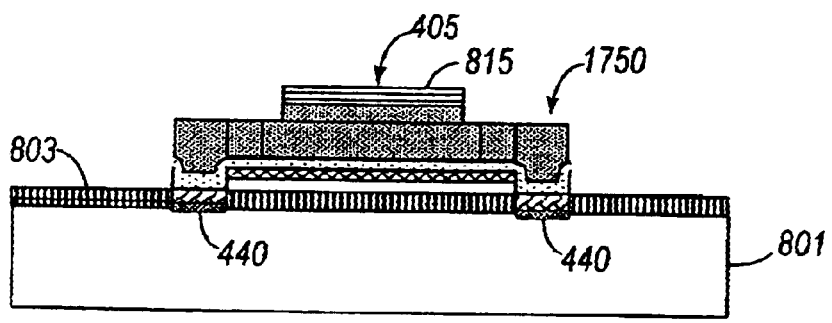

Photoresist lift-off mask 706 is applied over remaining portion of MoCr layer 1714 and exposed portion of MoCr layer 1712. Lift-off mask 706 is patterned as shown in FIG. 7f to expose only the surface of mirror 405. Gold layer 815 is then sputter deposited to coat mirror 405 with gold as shown in FIG. 17j. After gold layer 815 has been deposited, lift-off mask 706 along with the portion of gold layer 815 overlying lift-off mask 706 is removed using an acetone soak. The resulting structure is shown in FIG. 17k. Finally, the structure shown in FIG. 17l is released using xenon difluoride (XeF$_2$) which removes sacrificial amorphous silicon layer 804. Removal of amorphous silicon layer 804 causes release of structure 1750. Structure 1750 raises up from substrate 801 due to the internal stress gradient in MoCr layer 1712. Since MoCr layer 1712 forms suspension arms 450 (see also FIG. 4), the internal stress gradient in MoCr layer 1712 acts to force up all four of suspension arms 450, thereby raising mirror 405.

Tilt mirror 106 flatness can also be achieved by making tilt mirrors 106 from two adjacent stress polysilicon layers with opposite stress gradients. Polysilicon can be stressed by adjusting deposition temperature (as opposed to pressure for MoCr) during LPCVD. Stresses on the order of 500 mPa can be readily achieved as has been shown by Arthur Heuer of Case Western Reserve University.

Figure 18A:
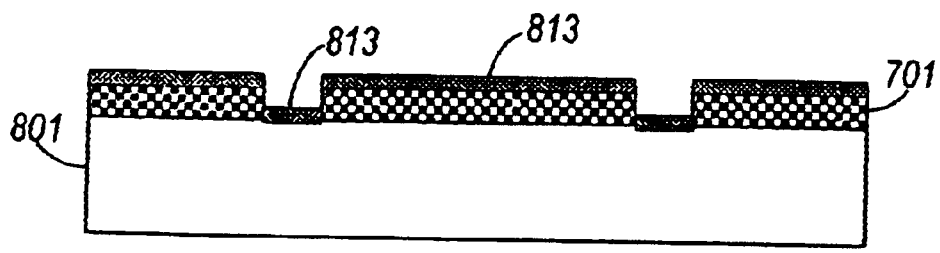
FIGS. 18a–m show the processing steps in accordance with an embodiment of the invention.
Figure 18B:
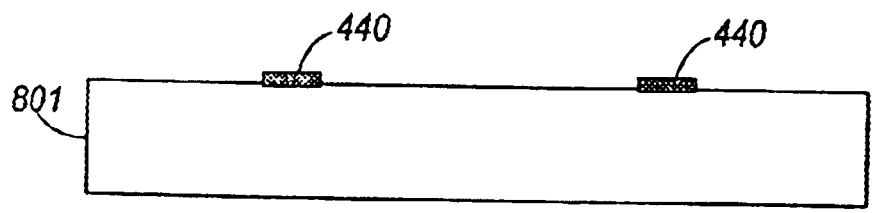
Figure 18C:
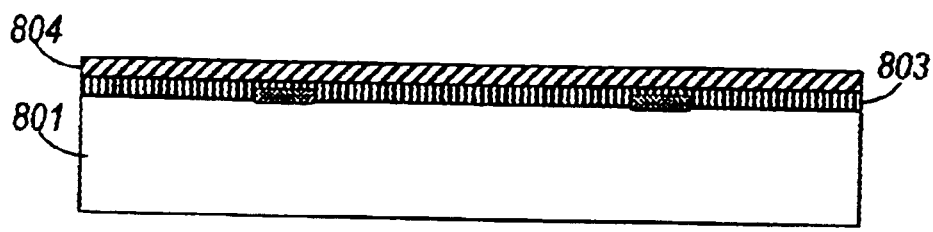

FIGS. 18a–18m show the fabrication steps for MEMS tilt mirrors 106 using glass as the substrate in accordance with an embodiment of the invention to produce opposing stress. FIGS. 18a–18m are cross-sectional views taken substantially along line 8—8 in FIG. 9. High quality unannealed glass substrate 801 is cleaned prior to application of photoresist lift-off mask 701. After application, lift-off mask 701 is patterned as shown in FIG. 18a for anchor points 440, actuation electrodes 410 and electrical contacts (not shown). Typically, 100 nm of chromium 813 is sputter deposited over lift-off mask 701. FIG. 18b shows removal of photoresist lift-off mask 701 and the portion of chromium layer 813 overlying photoresist lift-off mask 701 using an acetone soak and leaving actuation electrodes 410 (see FIG. 4) and anchor points 440 in place. Using low pressure chemical vapor deposition (LPCVD), Si$_3$N$_4$ layer 803 having a typical thickness of about 150 nm is deposited over glass substrate 801, over actuation electrodes 410 (see FIG. 4) and anchor points 440 as shown in FIG. 18c.

Figure 18D:
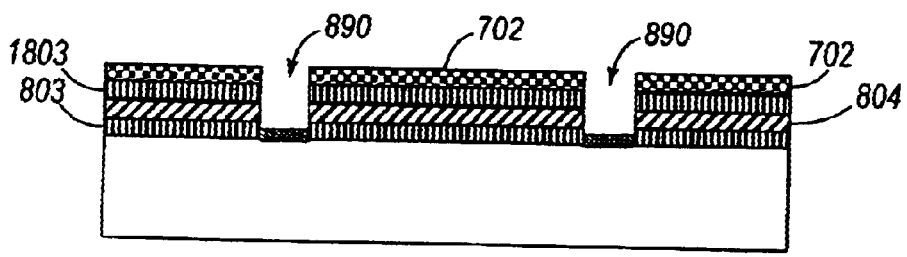
Figure 18E:
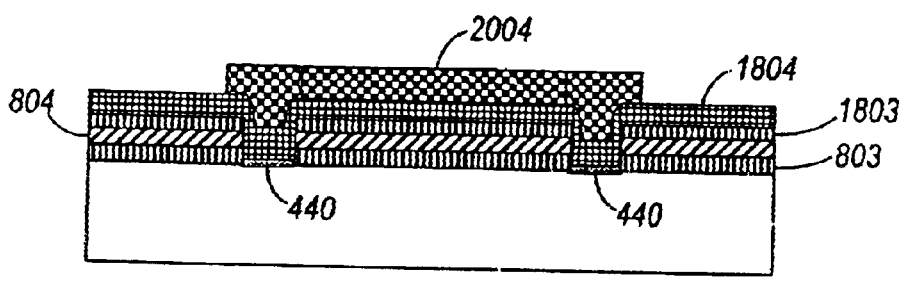
Figure 18F:
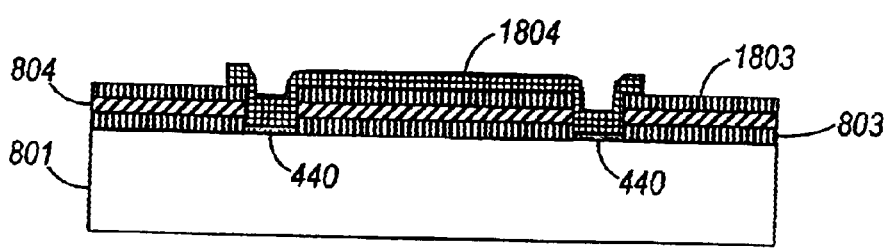

With reference to FIG. 18d, amorphous silicon layer 804 is LPCVD deposited over Si$_3$N$_4$ layer 803 to a typical thickness of about 500 nm. Then Si$_3$N$_4$ layer 1803 is LPCVD deposited over amorphous silicon layer 804 to serve as a first insulation layer against XeF$_2$ for the polysilicon structure to be deposited later. Photoresist mask 702 is applied over layer Si$_3$N$_4$ layer 1803 and patterned as shown in FIG. 7b. Vias 890 are dry etched using an O$_2$/SF$_6$ plasma down to anchor points 440 and electrical contacts (not shown). After removal of photoresist mask 702 using an acetone soak, stressed polysilicon layer 1804 is deposited using LPCVD and photoresist layer 2004 is applied over polysilicon layer 1804 and patterned as the inverse of mask 703 as shown in FIG. 7c. Exposed portion of polysilicon layer 1804 is dry etched in an O$_2$/SF$_6$ plasma etcher and photoresist layer 2004 is removed resulting in the structure shown in FIG. 18f.

Figure 18G:
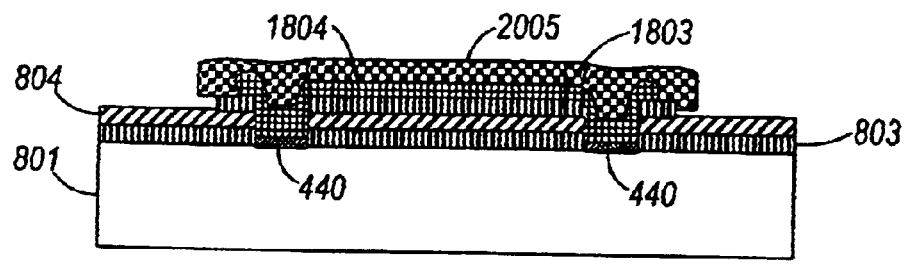
Figure 18H:
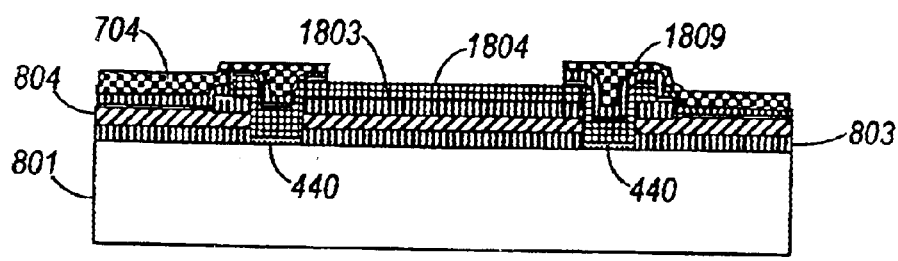

Photoresist layer 2005 is applied over polysilicon layer 1804 and patterned as the inverse of mask 703 shown in FIG. 7c but slightly optically magnified to produce an approximately 1 μm overhang. Then a timed wet etch using an HF solution is performed of exposed Si$_3$N$_4$ layer 1803 as shown in FIG. 18g. Photoresist layer 2004 is then removed using an acetone soak. Si$_3$N$_4$ layer 1809 is deposited to encapsulate polysilicon layer 1804. As shown in FIG. 18h, photoresist mask 704 is deposited over Si$_3$N$_4$ layer 1809 and patterned as shown in FIG. 7d to expose the mirror region. Si$_3$N$_4$ layer 1809 is then etched using an HF etchant.

Figure 18I:
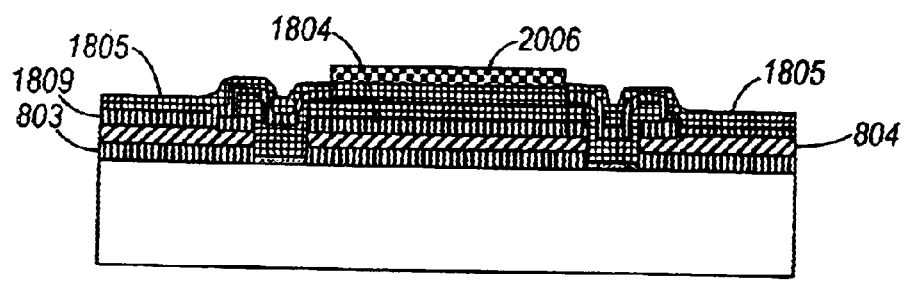
Figure 18J:
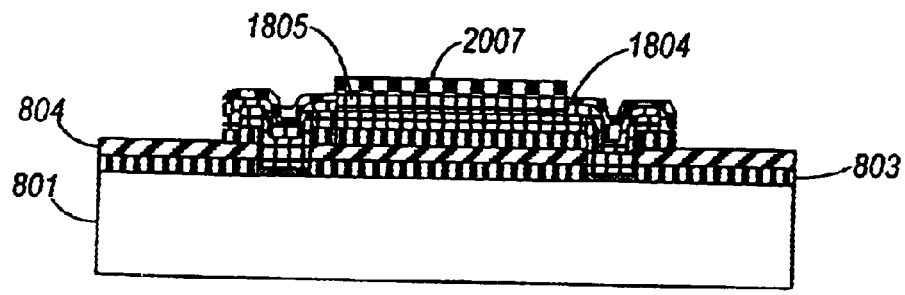

After removal of photoresist mask 704 using an acetone soak, polysilicon layer 1805 is deposited with a stress gradient opposite to polysilicon layer 1804. As shown in FIG. 18i, photoresist layer 2006 is then applied over polysilicon layer 1805 and patterned to be the inverse of mask 704 shown in FIG. 7d. Exposed. portions of polysilicon layer 1805 are then dry etched, stopping on Si$_3$N$_4$ layer 1809. Photoresist layer 2006 is then removed using an acetone soak. As shown in FIG. 18j, photoresist layer 2007 is applied over polysilicon layer 1805 and over exposed Si$_3$N$_4$ layer 1809 and patterned as the inverse of photomask 703 shown in FIG. 7c. Exposed Si$_3$N$_4$ layer 1809 is then etched away as shown in FIG. 18j. Photoresist layer 2007 is then removed using an acetone soak.

Figure 18K:
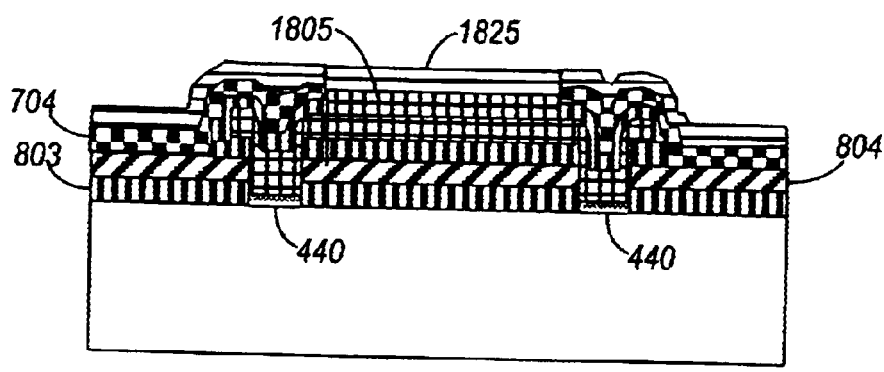
Figure 18L:
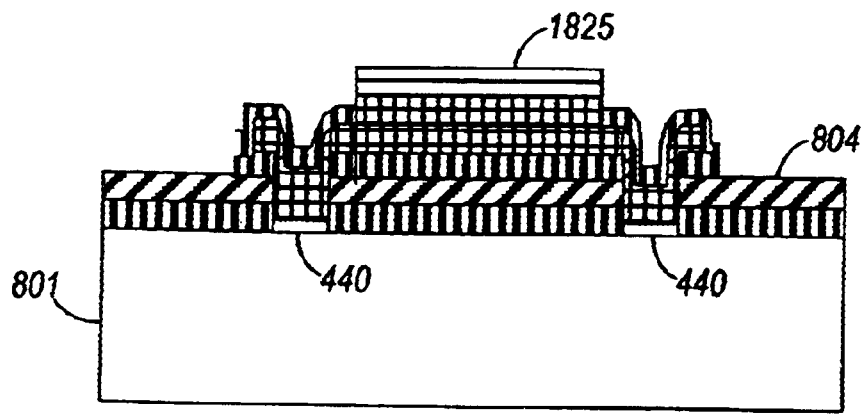
Figure 18M:
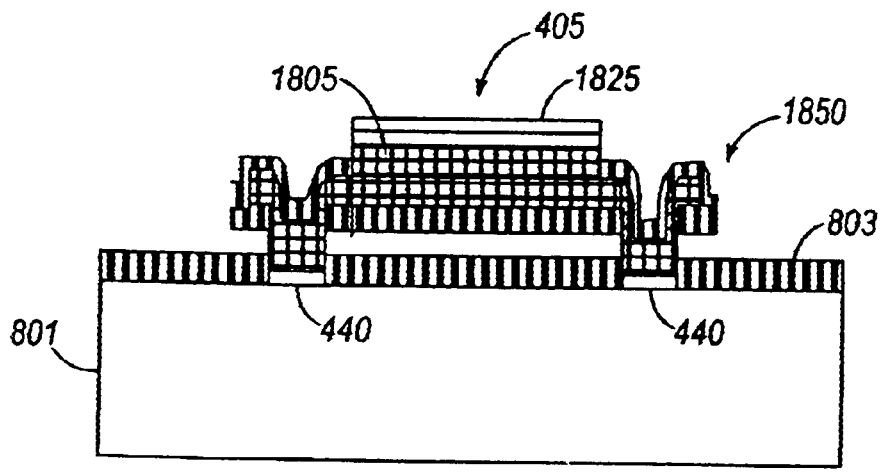

Photoresist mask 704 is applied over exposed portions of polysilicon layer 1805, amorphous silicon layer 804 and Si$_3$N$_4$ layer 1809 and patterned as shown in FIG. 7d. Gold layer 1825 is then deposited over photoresist mask 704 as shown in FIG. 18k. Subsequently, photoresist mask 704 is removed using a liftoff process to leave the structure shown in FIG. 18l. Note that all polysilicon layers are encapsulated against the upcoming xenon difluoride etch. Finally, the structure shown in FIG. 17m is released using xenon difluoride (XeF$_2$) which removes sacrificial amorphous silicon layer 804. Removal of amorphous silicon layer 804 causes release of structure 1850. Structure 1850 raises up from substrate 801 due to the internal stress gradient in polysilicon layer 1803. Since polysilicon layer 1803 forms suspension arms 450 (see also FIG. 4), the internal stress gradient in polysilicon layer 1803 acts to force up all four of suspension arms 450, thereby raising mirror 405.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A method comprising:

providing a substrate;

providing a plurality of suspension arms each comprising an internal stress gradient layer, each of said plurality of suspension arms having a first end and a second end, said first end being attached to said substrate;

providing a polysilicon area having a reflective surface layer, said polysilicon area being attached to said second end of said plurality of suspension arms; and providing a plurality of electrodes arranged on said substrate adjacent to said plurality of suspension arms to create an electric field for producing deflective movement of said polysilicon area having said reflective surface layer.

2. The method of claim 1 wherein said plurality of suspension arms is three in number.

3. The method of claim 1 wherein said substrate is glass.

4. The method of claim 1 wherein said internal stress gradient layer comprises MoCr.

5. The method of claim 4 wherein an internal stress gradient is on the order of 3 gigapascal across said stress gradient layer.

6. The method of claim 1 wherein said polysilicon area has a substantially square shape.

7. The method of claim 1 wherein said polysilicon area is comprised of two polysilicon layers having internal stress gradients acting in opposite directions.

8. A method of making an array of structures, each structure including:

a polysilicon area having a reflective surface layer;

a plurality of suspension arms to which the polysilicon area is attached; and a plurality of electrodes to create an electric field for producing deflective movement of the polysilicon area;

the polysilicon area, suspension arms, and electrodes being provided in accordance with claim 1.

9. The method of claim 8 wherein said array is a two dimensional rectilinear array.

10. The method of claim 1 wherein each of said plurality of electrodes is adjacent to and extends underneath one of said plurality of suspension arms.

11. The method of claim 1 wherein each of said plurality of electrodes has a substantially tapered shape.

12. A method comprising:

providing a glass substrate;

providing four suspension arms each comprising an internal stress gradient polysilicon layer, each said suspension arm having a first end and a second end, said first end being attached to said substrate;

providing a polysilicon area having a reflective surface layer, said polysilicon area being attached to said second end of each of said four suspension arms; and providing four electrodes arranged on said glass substrate adjacent to said four metal suspension arms, respectively, to create an electric field for producing deflective movement of said polysilicon area having said reflective surface layer.

13. A method of making an array of structures, each structure including:

a polysilicon area having a reflective surface layer;

four suspension arms to which the polysilicon area is attached; and four electrodes to create an electric field for producing deflective movement of the polysilicon area;

the polysilicon area, suspension arms, and electrodes being provided in accordance with claim 12.

14. The method of claim 13 wherein said array is a two dimensional rectilinear array.

15. The method of claim 1 in which each of the suspension arms extends away from the substrate to its second end; each arm's internal stress gradient layer moving the arm away from the substrate; the plurality of electrodes including, for each arm, an electrode that responds to an actuation signal by attracting the arm toward the substrate.

16. The method of claim 12 in which each of the suspension arms extends away from the substrate to its second end; each arm's internal stress gradient polysilicon layer moving the arm away from the substrate; the plurality of electrodes including, for each arm, an electrode that responds to an actuation signal by attracting the arm toward the substrate.

17. A method performed on a substrate, comprising:

producing an array of at least one mirror structure at a surface of the substrate, each mirror structure including:

two or more suspension arms, each arm having an internal stress gradient, each arm further having an end attached to the substrate's surface, the arm extending from the substrate's surface to an attachment point;

a mirror attached to the attachment points of the suspension arms, the mirror including a polysilicon area and a reflective area on the polysilicon area, the polysilicon area including parts of first and second polysilicon layers, the first and second polysilicon layers having internal stress gradients acting in different directions; and electrodes operable to deflect the suspension arms, the electrodes being operable together to tilt the mirror by deflecting the suspension arms.

18. The method of claim 17 in which the internal stress gradients of the first and second polysilicon layers act in opposite directions.

19. The method of claim 17 in which each polysilicon area of each mirror includes a first layer part and a second layer part, the act of producing the array comprises:

depositing and patterning the first polysilicon layer, the patterned first polysilicon layer including the first layer parts of the polysilicon areas; and depositing and patterning the second polysilicon layer over the first polysilicon layer, the patterned second polysilicon layer including the second layer parts of the polysilicon areas.

20. The method of claim 19 in which the first layer parts of the polysilicon areas are exposed when the second polysilicon layer is deposited, each polysilicon area's second layer part being over its first layer part.

21. The method of claim 19 in which the act of producing the array further comprises:

depositing and patterning a layer of gold, the layer of gold including, for each mirror, a gold coating over the second layer part of the mirror's polysilicon area.

22. The method of claim 17 in which each of the suspension arms includes part of the first polysilicon layer that provides the arm's internal stress gradient.

23. The method of claim 22 in which the act of producing the array further comprises:

releasing the mirror structures to allow the internal stress gradients of the suspension arms to raise the mirrors.

24. A method performed on a substrate structure, comprising:

producing an array of at least one optical device on the substrate structure each optical device including:

each arm two or more suspension arms, each including part of a polysilicon layer each arm further extending from a first end attached to the substrate structure to second end not attached to the substrate structure; the polysilicon layer having a internal stress gradient that moves the arm away from the substrate structure;

an optical element supported on the second ends of the suspension arms; and for each suspension arm, an electrode that responds to an actuation signal by attracting the suspension arm toward the substrate structure.

25. A method performed on a substrate structure, comprising:

producing an array of optical devices on the substrate structure, each optical device including:

two or more suspension arms, each arm further having a length extending from a first end attached to the substrate structure to a second end that is not attached to the substrate structure; each arm being movable between a first position in which the arm's length has an initial separation from the substrate structure and a second position in which the arm's length is drawn toward the substrate structure, decreasing at separation; each arm having an internal stress gradient polysilicon layer moving the arm's length toward the first position;

an optical element supported on the second ends of the suspension arms; and for each suspension arm, an electrode under the suspension arm, the electrode responding to an actuation signal by deflecting the suspension arm from its first position toward its second position; the electrodes responding individually to the actuation signals to tilt the optical element around two non-collinear axes.

26. A method performed on a glass substrate structure, comprising:

producing an array of mirror structures on the substrate structure, each mirror structure including:

two or more suspension arms, each arm having a length extending from a first end attached to the substrate structure to a second end that is not attached to the substrate structure; each arm being movable between a first position in which the arm's length has an initial separation from the substrate structure and a second position in which the arm's length is drawn toward the substrate structure, decreasing separation; each arm having an internal stress gradient polysilicon layer moving the arm's length toward the first position;

a mirror supported on the second ends of the suspension arms, the mirror including a polysilicon area and a reflective surface layer; and for each suspension arm, an electrode under the suspension arm, the electrode responding to an actuation signal by creating an electric field that deflects the suspension arm from its first position toward its second position by beginning to decrease separation at the arm's first end and proceeding to decrease separation along the length of the arm toward the arm's second end; the electrodes responding individually to the actuation signals to tilt the mirror around two non-collinear axes;

the act of producing the array of mirror structures comprising:

producing first, second, and third patterned layers over the substrate structure: the first patterned layer including the electrodes of the mirror structures; the second patterned layer being a polysilicon layer over the first patterned layer and including the internal stress gradient polysilicon layers of the suspension arms and the polysilicon areas of the mirrors: the third patterned layer being over the second patterned layer and including the reflective surface layers of the mirrors; and releasing the mirror structures to allow the internal stress gradient polysilicon layer of each suspension arm to move the suspension arm toward its first position.

\* \* \* \* \*